United States Patent
Chen

(10) Patent No.: US 8,994,067 B2
(45) Date of Patent: Mar. 31, 2015

(54) BOTH CARRIERS CONTROLLED THYRISTOR

(71) Applicant: Cheng Dian Intelligent-Power Microelectronics Design Co., Ltd. of Chengdu, Chengdu (CN)

(72) Inventor: Xingbi Chen, Chengdu (CN)

(73) Assignee: Cheng Dian Intelligent-Power Microelectronics Design Co., Ltd of Chengdu, Sichuan (CN)

( * ) Notice: Subject to any disclaimer, the term of this patent is extended or adjusted under 35 U.S.C. 154(b) by 11 days.

(21) Appl. No.: 14/011,073

(22) Filed: Aug. 27, 2013

(65) Prior Publication Data

US 2014/0048843 A1 Feb. 20, 2014

Related U.S. Application Data

(63) Continuation of application No. PCT/CN2011/083710, filed on Dec. 8, 2011.

(30) Foreign Application Priority Data

Feb. 28, 2011 (CN) .......................... 2011 1 0051556
Apr. 11, 2011 (CN) .......................... 2011 1 0089026

(51) Int. Cl.
 H01L 29/66 (2006.01)
 H01L 21/70 (2006.01)
 H01L 29/745 (2006.01)
 H01L 29/749 (2006.01)

(52) U.S. Cl.
 CPC .......... *H01L 29/7455* (2013.01); *H01L 29/749* (2013.01)

USPC ............ 257/133; 257/139; 257/141; 257/338

(58) Field of Classification Search
 USPC .......................... 257/111, 133, 139, 337, 338
 See application file for complete search history.

(56) References Cited

U.S. PATENT DOCUMENTS 5,714,774 A  2/1998  Otsuki
5,726,469 A  3/1998  Chen
(Continued)

FOREIGN PATENT DOCUMENTS

CN         101494239 A    7/2009
CN         2010100034     1/2010
(Continued)

OTHER PUBLICATIONS

Office Action (English Translation) mailed Nov. 25, 2014 in Japanese Patent Application No. 2013-555728, 6 pages.

*Primary Examiner* — Khiem D Nguyen
*Assistant Examiner* — Wilner Jean Baptiste
(74) *Attorney, Agent, or Firm* — Kilpatrick Townsend & Stockton LLP

(57) ABSTRACT

The present invention relates to a technique of semiconductor devices, and provides a semiconductor device, which uses two controllable current sources to control the electron current and the hole current of the voltage-sustaining region of a thyristor under conduction state, making the sum of the two currents from anode to cathode close to a saturated value under high voltage, thus avoiding the current crowding effect in local region and increasing the reliability of the device. Besides, it further provides a method of implementing the two current sources in the device and a method to improve the switching speed.

16 Claims, 18 Drawing Sheets

(56) References Cited

U.S. PATENT DOCUMENTS

| | | |
|---|---|---|
| 8,294,215 B2 | 10/2012 | Chen |
| 8,378,427 B2 | 2/2013 | Chen |
| 2009/0057711 A1* | 3/2009 | Chen .......................... 257/141 |
| 2010/0219446 A1* | 9/2010 | Chen .......................... 257/139 |
| 2010/0252883 A1* | 10/2010 | Chen .......................... 257/338 |
| 2011/0163351 A1* | 7/2011 | Chen .......................... 257/133 |

FOREIGN PATENT DOCUMENTS

| | | |
|---|---|---|
| DE | 1817497 A1 | 7/1970 |
| EP | 0581246 A2 | 2/1994 |
| JP | 60-172818 | 9/1985 |
| JP | 05-041515 | 2/1993 |
| JP | H07221281 A | 8/1995 |

* cited by examiner

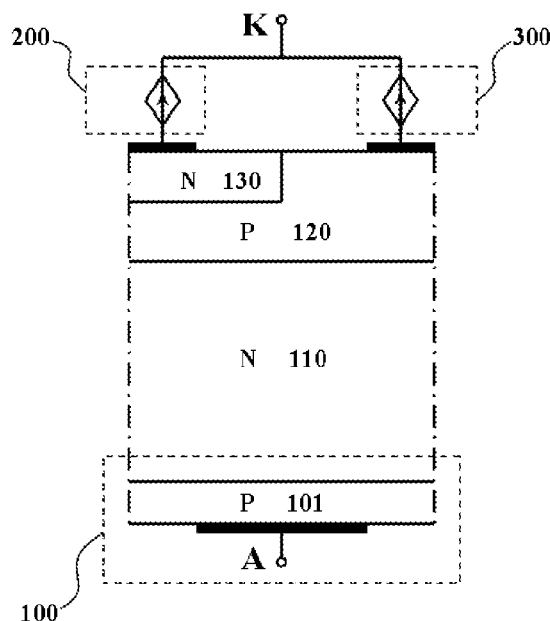
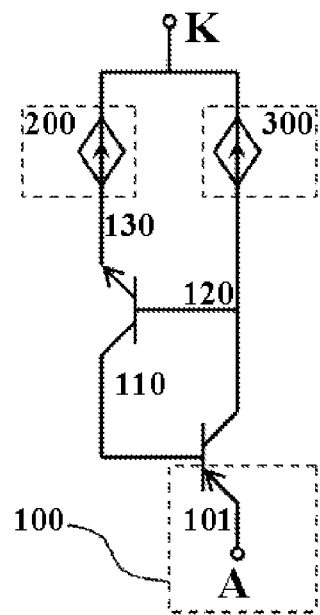
FIG. 1A
FIG. 1B
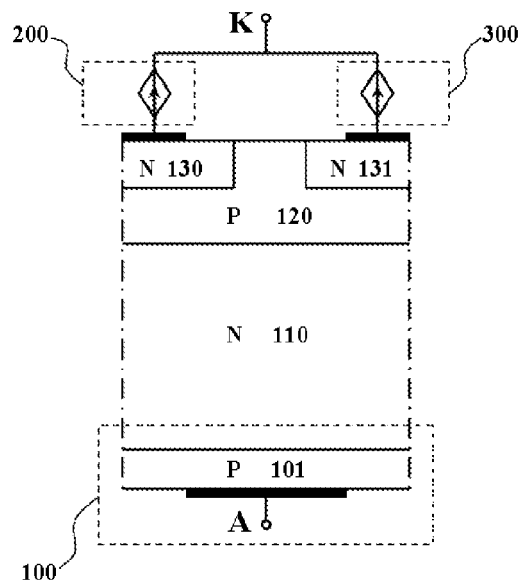
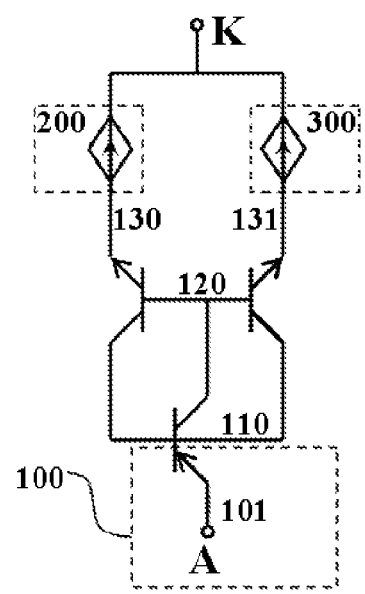
FIG. 2A
FIG. 2 B

BOTH CARRIERS CONTROLLED THYRISTOR

CROSS-REFERENCE TO RELATED APPLICATIONS

This application is a Continuation of International Application No. PCT/CN2011/083710, International Filing Date Dec. 8, 2011, and which claims the benefit of CN patent application No. 201110051556.X, filed Feb. 28, 2011, and CN patent application No. 201110089026.4, filed Apr. 11, 2011, the disclosures of all applications being incorporated herein by reference.

FIELD OF THE INVENTION

The present invention relates to a semiconductor device, particularly to a high power device.

DESCRIPTION OF THE RELATED ART

It is well-known that the on-state voltage drops across the voltage-sustaining region with high resistivity in the devices such as Thyristor, GTO (Gate Turn-Off Thyristor), MCT (MOS Controlled Thyristor) are very low due to taking advantage of excess carriers.

However, the phenomenon of current crowding is often encountered when an external signal is applied to turn off the GTO and MCT, and causes such devices to be destroyed. Such a phenomenon is mostly attributed to the regeneration function, which makes the current of a certain cell of the device increase tremendously when the voltage of the cell has subtle enhancement. Evidently, the reliability of the devices is greatly reduced due to the effect of current crowding.

REFERENCES

[1] X. B. Chen, U.S. patent application Ser. No. 12/712,583 (2010), or Chinese patent ZL 200910119961.3.
[2] X. B. Chen, U.S. Pat. No. 5,726,469.A, or Chinese patent ZL 95108317.1.
[3] X. B. Chen, Chinese Patent ZL 201010000034.2.

SUMMARY

One of the objects of this invention is:

1. In the steady on-state of the thyristor, the current from one terminal to another terminal of the device increases sharply with the increasing of the external voltage applied across the two terminals starting from a very low voltage; but with further increasing of the external voltage, the current tends to be saturated. Such saturated current varies with the change of the voltage of the signal, which controls the conduction of the device.

2. In the stage from the off-state to the on-state of the device, there is no current crowding effect during the switching time.

3. In the stage from the on-state to off-state of the device, there is no current crowding effect during the switching time.

4. During turning-off, the decrease of both types of carriers in the voltage-sustaining region is realized by eliminating the injection of both types of carriers into the voltage-sustaining region (drift region). By using such a method, fast turn-off of the device can be realized.

The present invention can be summarized by referring the preferred embodiments described as follows.

1. According to an embodiment of the present invention, a semiconductor device is provided. Its operation region is located between a first main surface (the top surface of the semiconductor in each figure showing the structure) and a second main surface (the bottom surface of the semiconductor in each figure showing the structure) of a semiconductor, comprising at least one cell of a first kind and/or at least one cell of a second kind and/or at least one cell of a third kind.

The cell of the first kind (the structure of the device shown in FIG. 1A, FIG. 1B, FIG. 2A, FIG. 2B, FIG. 3A, FIG. 3B, FIG. 4A~FIG. 4F, FIG. 5A, FIG. 5B, FIG. 6A, FIG. 6B, FIG. 7, FIG. 8, FIG. 9, FIG. 10, FIG. 11A, FIG. 11B, FIG. 12A and FIG. 12B) comprises: a first N-type region (N-type region 110, or N-type region 110 and N-type 103, or N-type region 110 and N-type 103 with N-type 102 in each figure, if any) serving as a main voltage-sustaining region; at least a first P-type region (P-type region 101 in each figure, if any) is contacted with the second main surface on one side and contacted with the first N-type region (N-type region 110 or N-type region 103 in each figure, if any) on the opposite side; the first N-type region is contacted at least to a second P-type region (P-type region 120 or 123 and/or 122 and/or 121 in each figure, if any) located under the first main surface; inside the second P-type region, different portions of second N-type region (130, 131, 132) is formed and surrounded by different portions of second P-type region and the semiconductor surface, wherein one portion of second N-type region (N-type region 130) is connected with a first terminal of a first controlled current source (200 in each figure, if any); a first terminal of a second controlled current source (300 in each figure, if any) is connected directly or indirectly through another portion of second N-type region or indirectly through a P-type region to the second P-type region; both second terminals of the controlled current sources are connected with a first conductor, which is a first electrode (K in each figure, if any); the first controlled current source controls the electron current flowing through the first N-type region (N-type region 110 in each figure, if any), the second controlled current source controls the hole current flowing through the first N-type region (N-type region 110 in each figure, if any); the current through the first electrode is controlled by both current sources. The second main surface has either of two connection methods: a first connection method is that only a second conductor (the bold black line connected with 101 in each figure, if any) is connected with the first P-type region (P-type region 101 in each figure, if any), the second conductor is a second electrode (A in each figure, if any); a second connection method is that besides the second conductor, there is a third conductor (B in FIG. 4E~FIG. 4F), connected with the first N-type region (N-type region 102 in FIG. 4E or in FIG. 4F).

The cell of the second kind has not only the features of the cell of the first kind, but also has features wherein a portion of the first N-type region (N-type region 110 in FIG. 13A, FIG. 13B, FIG. 14A, FIG. 14B, FIG. 15A, FIG. 15B, FIG. 16A, FIG. 16B, and FIG. 17) is contacted directly to a portion of the first main surface; a first insulator layer (161 in FIG. 13A, FIG. 13B and 162 in FIG. 14A~FIG. 17) covers on semiconductor surface from a place of the portion of the first N-type region to a place of the first terminal of either one or both of controlled current sources and is covered by a conductor serving as a gate, controlling a current between the first N-type region and the first terminal of either one or both of controlled current sources.

The cell of the third kind has not only the features of the cell of the first kind, but also has features wherein a second insulator layer (660 in FIG. 18) covers on the first main surface from a part of a second P-type region (601 in FIG. 18) to a P-type region serving as junction edge termination region (602 and 600 in FIG. 18) located outside the boundary of the active operating region; the junction edge termination region is located underneath the first main surface and started from a first side located at the boundary of the active region and ended at a second side located at a place (400 in FIG. 18) of the first N-type region where no electric field exists even under very high voltage is applied across the first electrode and the second electrode (electrodes A and K); a conductor covers on the second insulator layer (660 in FIG. 18) serving as a turn-off gate ($G_0$ in FIG. 18); a low-voltage circuit is implemented outside the second side of the junction edge termination region; the low-voltage circuit has two output terminals (A and B of region 800 in FIG. 19): a first one is connected with the second electrode (electrode A) and a second one is connected with the third conductor (electrode B in FIG. 19); the low-voltage circuit has two input terminals, wherein a first input terminal is connected to the second side (400 in FIG. 18) of the junction edge termination region, a second input terminal is connected to a portion in the junction edge termination region but close to the second side, the second input terminal serves as a controlling terminal (810 in FIG. 19) of the low-voltage circuit.

2. Referring to FIG. 4C and FIG. 4D, the third conductor (the base, electrode B according to 1) is connected directly to the second electrode (electrode A), not connected to the second output terminal of the low-voltage circuit.

3. The two current sources not only can be externally connected, but also can be implemented in the device. The present invention provides the methods of the latter as well.

Referring to FIG. 5A, FIG. 5B and FIG. 13A, FIG. 13B, wherein an area of the second P-type region up to the first main surface is divided into three portions (121, 123 and 122) isolated one to another by the first N-type region (110); each portion has its own second N-type region (130, 131 and 132) surrounded individually by each second P-type portion (121, 123 and 122) and the first main surface; wherein in a first portion, a dose of doping of the second N-type region (130) is much larger than a dose of doping of the second P-type region (121) surrounding it, and in a second portion, a dose of doping of the second N-type region (131) is much smaller than a dose of doping of the second P-type region (123) surrounding it; wherein the second P-type region (122) in third portion is connected with its own second N-type region (132) by using a floating ohmic contact (FOC) or a conductor on the first main surface; a third P-type region (140) is surrounded by the second N-type region (132) of the third portion and the first main surface, the third P-type region (140) contains at least two n-IGFETs (described as n-MISFETs hereinafter); two source regions (202 and 302) of the two n-MISFETs are connected through the first conductor (electrode K) to the third P-type region (140) serving as a source-body region of both two n-MISFETs; the two drain regions (201 and 301) of the two n-MISFETs are connected with the second N-type regions (130 and 131) of the first portion and of the second portion, respectively; at least two insulator layers (260 and 360) are formed on the first main surface, each of them covers on a part of each drain region (201 and 301), a part of each source region (202 and 302) and source-body region (140) of each n-MISFET, respectively; the two insulator layers are covered by two conductors serving as two gates ($G_1$ and $G_2$) of the two n-MISFETs, controlling two currents of the two n-MISFETs, respectively.

4. Besides, the second P-type region can also be divided by trenches filled with insulators.

Referring to FIG. 7, wherein an area of the second P-type region up to the first main surface is divided into three portions (121, 123 and 122) isolated one to another by trenches filled with insulators (171 and 172); each portion has its own second N-type region (130, 131 and 132) surrounded individually by each second P-type portion (121, 123 and 122) and the first main surface; wherein in a first portion, a dose of doping of the second N-type region (130) is much larger than a dose of doping of the second P-type region (121), in a second portion, a dose of doping of the second N-type region (131) is much smaller than a dose of doping of the second P-type region (123); wherein the second P-type region (122) in third portion is connected with its own second N-type region (132) by using a floating ohmic contact (FOC) or a conductor on the first main surface; a third P-type region (140) is surrounded by its own second N-type region (132) and the first main surface, the third P-type region (140) contains at least two n-MISFETs; two source regions (202 and 302) of the two n-MISFETs are connected through the first conductor (electrode K) to the third P-type region (140) serving as a source-body region of both two n-MISFETs; two drain regions (201 and 301) of the two n-MISFETs are connected with the second N-type regions (130 and 131) of the first portion and of the second portion, respectively; at least two insulator layers (260 and 360) are formed on the first main surface, each of them covers on a part of each drain region (201 and 301), a part of each source region (202 and 302) and source-body region (140) of each n-MISFET, respectively; the two insulator layers are covered by two conductors serving as two gates ($G_1$ and $G_2$) of the two n-MISFETs, controlling two currents of the two n-MISFETs, respectively.

5. Also, the second P-type region can be partly divided by trenches filled with insulators.

Referring to FIG. 8, wherein an area of the second P-type region up to the first main surface is partly divided into three portions (121, 123 and 122), where divided parts are isolated one to another by trenches filled with insulators (171 and 172); each portion has its own second N-type region (130, 131 and 132) surrounded individually by each second P-type portion and the first main surface; wherein in a first portion, a dose of doping of the second N-type region (130) is much larger than a dose of doping of the second P-type region (121) surrounding it, in a second portion, a dose of doping of the second N-type region (131) is much smaller than a dose of doping of the second P-type region (123) surrounding it; wherein the second P-type region (122) in third portion is connected with its own second N-type region (132) by using a floating ohmic contact (FOC) or a conductor on the first main surface; a third P-type region (140) is surrounded by its own second N-type (132) region and the first main surface, the third P-type region (140) contains at least two n-MISFETs; two source regions (202 and 302) of the two n-MISFETs are connected through the first conductor (electrode K) to the third P-type region (140) serving as a source-body region of both two n-MISFETs; two drain regions (201 and 301) of the two n-MISFETs are connected with the second N-type regions (130 and 131) of the first portion and of the second portion, respectively; at least two insulator layers (260 and 360) are formed on the first main surface, each of them covers on a part of each drain region (201 and 301), a part of each source region (202 and 302) and source-body region (140) of each n-MISFET, respectively; the two insulator layers are covered by two conductors serving as two gates ($G_1$ and $G_2$) of the two n-MISFETs, controlling two currents of the two n-MISFETs, respectively.

6. However, the three portions of the second P-type region can be connected together.

Referring to FIG. 6A and FIG. 6B, wherein an area of the second P-type region up to the first main surface is divided into three portions (121, 123 and 122) connected each other; each portion has its own second N-type region (130, 131 and 132) surrounded individually by each P-type portion and the first main surface, wherein: in a first portion, a dose of doping of the second N-type region (130) is much larger than a dose of doping of the second P-type region (121) surrounding it; in a second portion, a dose of doping of the second N-type region (131) is much smaller than a dose of doping of the second P-type region (123) surrounding it; wherein the second P-type region (122) in third portion is connected with its own second N-type region (132) by using a floating ohmic contact (FOC) or a conductor on the first main surface; a third P-type region (140) is surrounded by its own second N-type region (132) and the first main surface, the third P-type region (140) contains at least two n-MISFETs; two source regions (202 and 302) of the two n-MISFETs are connected through the first conductor (electrode K) to the third P-type region (140) serving as a source-body region of both two n-MISFETs as well; two drain regions (201 and 301) of the two n-MISFETs are connected with the second N-type regions (130 and 131) of the first portion and of the second portion, respectively; at least two insulator layers (260 and 360) are formed on the first main surface, each of them covers on a part of each drain region (201 and 301), a part of each source region (202 and 302) and source-body region (140) of each n-MISFET, respectively; the two insulator layers are covered by two conductors serving as two gates ($G_1$ and $G_2$) of the two n-MISFETs, controlling two currents of the two n-MISFETs, respectively.

7. Referring to FIG. 3A and FIG. 3B, wherein the second N-type region (131) in the second portion according to 3-6, is connected with an additional P-type region (133) in it through a conductor.

8. Referring to FIG. 12A and FIG. 12B, the current source in the second P-type region can be set in another way, wherein: a second N-type region (132) surrounded by the second P-type region (123 and 122) and the first main surface, and both regions are connected through FOC or a conductor on the first main surface; a third P-type region (140) is surrounded by the second N-type region (132) and the first main surface; at least two n-MISFETs are implemented in the third P-type region (140); two N-type regions surrounded by the third P-type region (140) and the first main surface are set to form two source regions (202 and 302) of the two MISFETs, the two source regions are connected with the third P-type region (140) through a conductor serving as the first electrode (electrode K) on the first main surface; another two N-type regions surrounded by the third P-type region (140) and the first main surface are set to form two drain regions (201; 301 and 144) of the two MISFETs; one of the drain region (201) is connected through a conductor to a second N-type region (130); a still another P-type region (143) is surrounded by another of the two drain regions (144) and the first main surface; the still another P-type region (143) is connected to the second P-type region (123 in FIG. 12A) as well as the second N-type region (132); at least two insulator layers (260 and 360) cover on the first main surface, each one is started from a part of a drain region (201 and 301) via a third P-type source-body region (140) and ended at a part of a source region (202 and 302); the two insulator layers are covered by conductors serving as gates ($G_1$ and $G_2$) of the two n-MISFETs and control currents through the two MISFETs, respectively.

9. The current sources can also be located in SIS (Silicon Insulator Silicon). Referring to FIG. 9 and FIG. 10, the two current sources according to 1 are implemented in a third P-type region (140) which is isolated with other regions having no current source by insulators (171, 172 and 173).

10. A method to generate automatically a voltage applied to the gate $G_{on}$ is proposed in an embodiment of the present invention.

Referring to FIG. 15A, FIG. 15B, a method to generate automatically a voltage applied to the gate in the cell of the second kind ($G_{on}$) is connected it to a heavily doped first N-type region (111) located beneath the first main surface through a conductor.

11. A gate $G_{off}$ is added in an embodiment of the present invention in order to make the two current sources being unable to provide current for the second N-type region and the second P-type region.

Referring to FIG. 16A, FIG. 16B and FIG. 17, the third portion according to 3 or 4, or 5 or 6, or 9 or 10, wherein a p-MISFET is formed for helping to turn-off a current through the first electrode; the second P-type portion (123) serves as a source region, the second N-type region (132) serves as a substrate region and the third P-type region (140) serves as a drain region of the p-MISFET, respectively; an insulator (163) covers on the first main surface starting from a part of the source region, via the substrate region and ending at a part of drain region of the p-MISFET; the insulator is covered by a conductor serving as a gate ($G_{off}$) of the p-MISFET.

Obviously, the method to ensure the voltage drop across the P-region 123 and P-region 140 lower than the forward voltage drop of a P-N junction (about 0.7V for Si devices) also can be realized by forming an n-MISFET between the N-region 132 and P-region 140.

12. Certainly, clamping diodes can be used in an embodiment of the present invention to clamp the voltage between the two current sources.

According to 4 or 5, or 6 or 8, or 9 or 11, referring to FIG. 11A, FIG. 11B, FIG. 12A, FIG. 12B, FIG. 14A, FIG. 14B, FIG. 15A, FIG. 15B and FIG. 16A, FIG. 16B, at least two series clamping diodes are implemented between the second P-type region (122) and the third P-type region (140).

13. A method to implement the low voltage circuit power supply with respect to the first electrode (K) for the two current sources is proposed in an embodiment of the present invention.

Referring to FIG. 21A and FIG. 21B, a semiconductor device according to 1, wherein the second P-type region (120) is connected through FOC or a conductor on the first main surface with a second N-type region (132) inside of it; a third P-type region (140) is inside the second N-type region (132) and is contacted with a conductor serving as the first electrode (K); a third N-type region (146) is surrounded by the third P-type region (140) and the first main surface, and is contacted with a conductor serving as an electrode of a power supply with respect to the first electrode; a fourth P-type region (145) is surrounded by the third N-type region (146), and is contacted with a conductor connected to a conductor (H) covering on a portion underneath first main surface of the first N-type region (111) having a large dose of doping; a capacitor ($C_1$) is connected with its one terminal to the electrode of a power supply and another terminal to the first electrode; the capacitor serves as a power supply of a low-voltage circuit implemented in the third P-type region (140); wherein at least one input terminal ($G_C$) of the low-voltage circuit receives an external applied signal and two output terminals of the low-voltage circuit are the control voltages of the two controlled current sources or the second P-type region (120); the capacitor is an external component or a Conductor-Insulator-Conductor capacitor implemented in the chip of the semiconductor device.

14. A method to apply a power supply with respect to the second electrode A to a low-voltage circuit is proposed.

Referring to FIG. 20, a semiconductor according to 1, wherein: a conductor is contacted to a portion of the junction edge termination region close to its second side on the first main surface; the conductor is connected to another conductor on the first main surface contacted with an N-type region (802) surrounded by a P-type region (801) and located outside of the second side of the junction edge termination region; a terminal of a capacitor ($C_0$) is connected to a further N-type region located outside of the junction edge termination region (803), another terminal of the capacitor ($C_0$) is connected to the P-type region (801) and located outside of the second side of the junction edge termination region; the capacitor ($C_0$) serves as a power supply to a low-voltage circuit outside the second side of the junction terminal region; the capacitor is an external component or a Conductor-Insulator-Conductor capacitor implemented in the chip of the semiconductor device.

15. A method to implement the clamping diodes is described as below.

Referring to FIG. 11A and FIG. 12A, wherein: an N-type region (126) is surrounded by the second P-type region (122) and the first main surface, forming a first diode; a P-type region (141) is surrounded by an N-type region (142) and the first main surface, forming a second diode; the N-type region (142) surrounding the P-type region (141) is in turn surrounded by a P-type region (140) and the first main surface, and connected with the first conductor (K); the two diodes are in series connection through a conductor connecting the N-type region (126) of the first diode with the P-type region (141) of the second diode.

BRIEF DESCRIPTION OF THE DRAWINGS

FIG. 1A schematically shows one structure for illustrating the principle of the present invention;

FIG. 1B shows the simple equivalent circuit of FIG. 1A;

FIG. 2A schematically shows another structure for illustrating the principle of the present invention;

FIG. 2B shows the simple equivalent circuit of FIG. 2A;

DESCRIPTION OF THE EMBODIMENTS

Figure 3A:
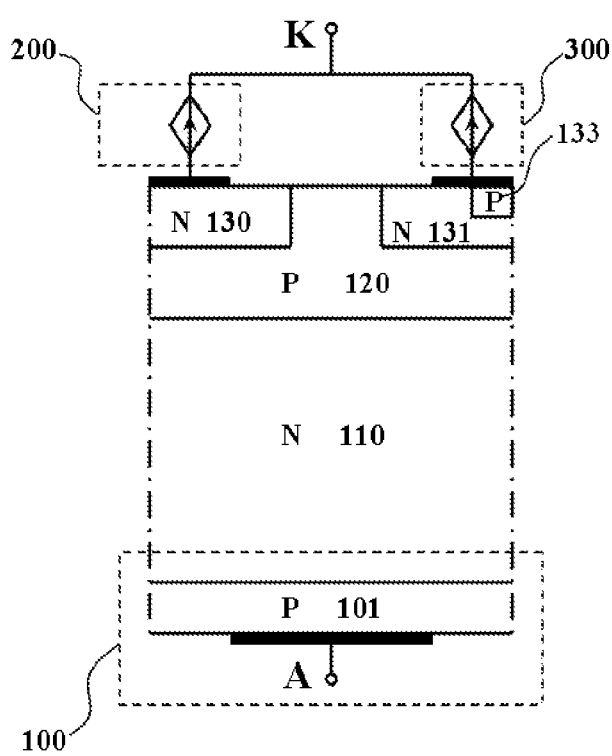
FIG. 3A schematically shows still another structure for illustrating the principle of the present invention.

The present invention will be described and illustrated in detail, and the examples of the application of the present invention will be demonstrated hereinafter. In all of the following figures, the same number represents the same component or element.

All of the conductors in the following figures are indicated by bold lines hereinafter.

The basic structure and simple equivalent circuit of the active region of the thyristor proposed in the present invention are shown in FIG. 1.

FIG. 1A shows the basic structure of the active region proposed in the present invention. An anode A located at the bottom of this figure is connected to a first P-type region 101 through a conductor to inject holes into a first lightly doped N-type region 110, which serves as the voltage-sustaining region. There is a second P-region 120 upon the voltage-sustaining region. The upper right portion of the second P-region 120 is connected in series to a current source 300 through a conductor and then connected to a cathode K. Thus, when the external voltage $V_{AK}$ is higher than zero, P-region 101, N-region 110 and P-region 120 construct the emitter region, base region, and collector region of the first transistor (PNP), respectively.

There is an N-region 130 upon the left part of the second P-region 120, which is connected to a current source 200 through a conductor and then connected to the cathode K. When the voltage $V_{AK}$ is higher than zero, the electrons are emitted from the N-region 130 to the P-region 120 and extracted by the N-region 110. Thus, N-region 130, P-region 120, and N-region 110 construct the emitter region, the base region, and the collector region of the second transistor (NPN), respectively.

FIG. 1B shows the equivalent circuit composed of two transistors and two current sources.

The most important difference between the structure shown in FIG. 1A and the devices of GTO and MCT lies in the two current sources.

The purpose of setting two current sources is to make sure the carrier densities in the voltage-sustaining region with the current flowing satisfy the following condition:

$$n - p - N_D^+ \approx 0 \quad (1)$$

where n, p and $N_D^+$ are the densities of electrons, holes and the effective ionized donors in the N-region 110. When the current is large enough, both n and p are much higher than $N_D^+$. If n>>p, the voltage-sustaining region is equivalent to a heavily doped P-region, and thus can not sustain a very high voltage. If p>>n, the voltage-sustaining region is equivalent to a heavily doped N-region, and also can not sustain a very high voltage. Obviously, in both cases, a saturation of current at a high voltage can not be realized.

Note that for Si, when the electric field is higher than $2 \times 10^4$ V/cm, the velocities of electron and hole are approximately equal to their saturation values, $v_{Se}$ and $v_{Sh}$, respectively. On the other hand, when the electric field is higher than $2 \times 10^5$ V/cm, the impact ionization rate will be significant. Hence, to satisfy the condition of (1), it is only required that the ratio of current density of electron to the one of hole $(J_e/J_h) = (v_{Se}/v_{Sh})$. Since for Si, $(v_{Se}/v_{Sh}) \approx 1$, the requirement of (1) is that the electron current density equals to the hole current density.

According to the method of FIG. 1, in order to maintain the P-N junction composed of the P-region 120 and the N-region 130 forward biased for injection, the potential of the P-region 120 connected with 300 should be higher than that of the N-region 130 connected with 200. This higher value is about 0.7V for Si, which obviously causes more power dissipation per unit area. Therefore, a separation of the top N-region into a heavily doped region 130 and a lightly doped region 131 shown in FIG. 2A is made. Meanwhile, the dose of doping in the portion of the P-region 120 surrounding the N-region 130 is made to be very low, and the portion of the P-region 120 surrounding the N-region 131 is made to be very high. Thus, the N-region 130 and the P-region 120 form an $N^+$-$P^-$ junction and the main current flows through this junction is an electron current; the N-region 131 and the P-region 120 form an $N^-$-$P^+$ junction and the main current flows through this junction is a hole current.

FIG. 2B shows the simple equivalent circuit of FIG. 2A.

Figure 3B:
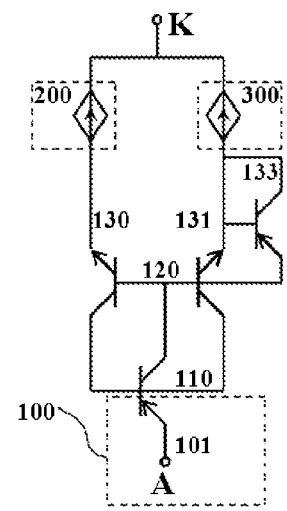
FIG. 3B shows the simple equivalent circuit of FIG. 3A.

The conductor connecting 300 and the N-region 131 in FIG. 2A can also be contacted simultaneously with a P-region 133, as shown in FIG. 3A. The PNP composed of the P-region 120, N-region 131 and P-region 133 is a transistor with collector shorted. The equivalent circuit is shown in FIG. 3B.

There are several structures of region 100 beneath the voltage-sustaining region 110 of FIG. 1A, as shown in FIG. 4. In FIG. 4A, the voltage-sustaining region 110 is directly connected with a P-region 101 which is connected with the electrode A. The difference between FIG. 4B and FIG. 4A lies in the addition of an N-buffer layer 103. This region has a heavier doping concentration than the N-region 110 with a small thickness. A structure of anode shorted is shown in FIG. 4C, wherein the electrode A is connected with the P-region 101 and the voltage-sustaining region 110 through an N-region 102. Sometimes, in order to achieve a better effect of anode shorted, an N-region 103 beneath the N-region 110 with a heavier doping concentration than the N-region 110 is needed, as shown in FIG. 4D. In the structure shown in FIG. 4E, the N-voltage-sustaining region 110, the base region, is connected to the outer through the N-region 102, which is contacted with the electrode B. FIG. 4F shows the structure based on FIG. 4E, wherein the N-region 103 with a heavier doping concentration is set on the P-region 101 as well as on the N-region 102 to achieve a better effect of an anode-short. Both of the structures shown in FIG. 4E and FIG. 4F are used for fast turn-off and the specific application of them will be described later. In the following figures, the connection method is shown as FIG. 4A, which, of course, can be replaced by any method shown in FIG. 4B, FIG. 4C, FIG. 4D, FIG. 4E or FIG. 4F. When the method shown in FIG. 4E is utilized in the following figures, FIG. 4F can also be used.

Figure 5A:
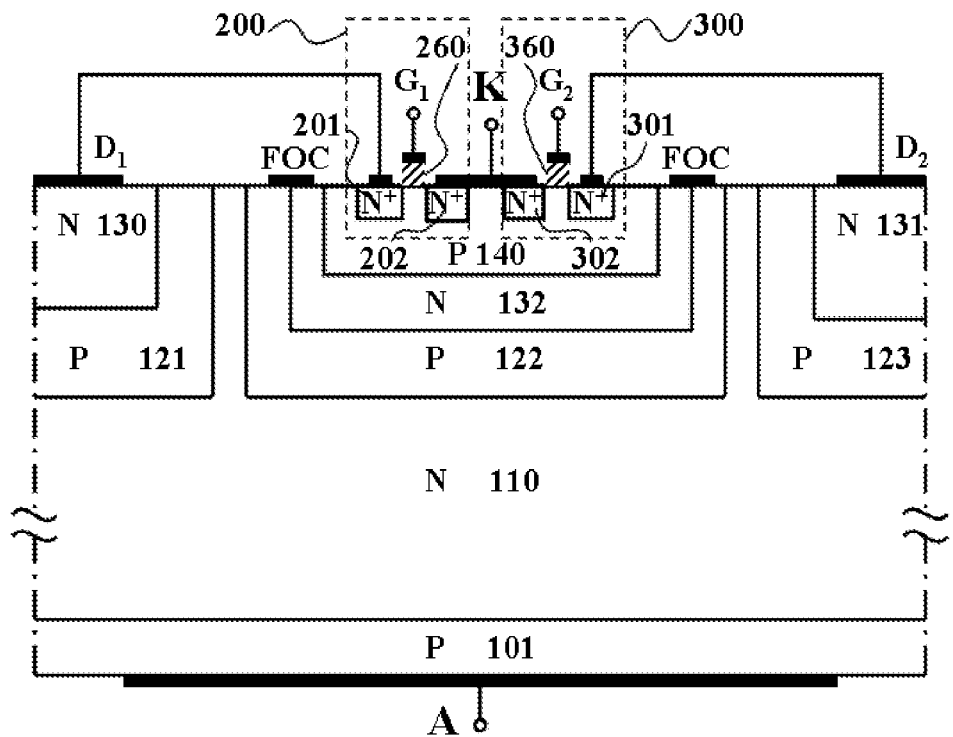
FIG. 5A shows schematically a structure with current sources implemented in the chip.

The current sources 200 and 300 in the FIG. 2A can be externally connected to the chip, but also can be integrated in the same chip with the thyristor. FIG. 5A shows a cell with the current sources implemented inside the chip. Here, the P-region 120 is divided into three individual P-regions: 121, 122, and 123. The N-region 130 is set in the P-region 121 and the N-region 131 is set in the P-region 123. The current sources are set in a P-region 140 which is surrounded by an N-region 132, which is connected with the P-region 122 by floating ohmic contacts (FOC) on the first main surface (the top surface). As the source substrate region for two n-MISFETs, the P-region 140 is connected with the source regions 202 and 302 of two n-MISFETs at surface through a conductor. The drain regions of the two n-MISFETs are $N^+$-regions 201 and 301, which are connected through conductors to an electrode $D_1$ on the N-region 130 and $D_2$ on the N-region 131, respectively. There are two insulators 260 and 360 covering on the source substrate region from a part of the source region to a part of the drain region of the two n-MISFETs, respectively. The two conductors covering on the insulators are the gates $G_1$ and $G_2$ of the two n-MISFETs, respectively. The currents of the two n-MISFETs are controlled by the external voltages of $G_1$ and $G_2$, thereby the currents flowing through 130 and 131 can be controlled. In practice, the doping concentration of the P-region 121 can be much smaller than that of the N-region 130 which is surrounded by 121. As a result, the current flowing through 130 is a current with electron flow downward dominantly. On the contrary, the doping concentration of the P-region 123 is much larger than that of the N-region 131 which is surrounded by 123. As a result, the current flowing through 130 is dominantly a hole current with hole flow upward. Since both of the forward voltages making the P-N junctions composed of 130 and 121 and that composed of 123 and 131 to be turned on are 0.7V (for Si). The two n-MISFETs are supposed to be implemented with the same electrical characteristics. Then, whenever the currents flowing through the two n-MISFETs are not equal, the voltage drop across the two n-MISFETs would not be equal and the side with larger current has higher voltage drop, resulting in the voltage drop across the P-N junction, 121-130 or 123-131, decreasing. This means there is a negative feedback. And through which, the requirement that the electron current and the hole current should be equal or approximately equal is easily realized. Each of the n-MISFETs in FIG. 5A serves as a current source since it has the following feature. When the voltage drop across it varies significantly, the current through it varies less than that of the P-N junction at the same value of variation of voltage drop.

Figure 5B:
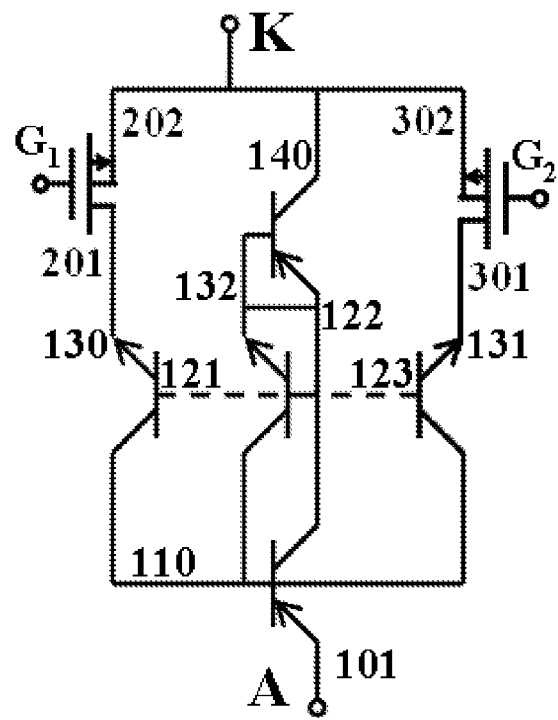
FIG. 5B shows the simple equivalent circuit of FIG. 5A.

FIG. 5B shows the simple equivalent circuit of FIG. 5A.

Figure 6A:
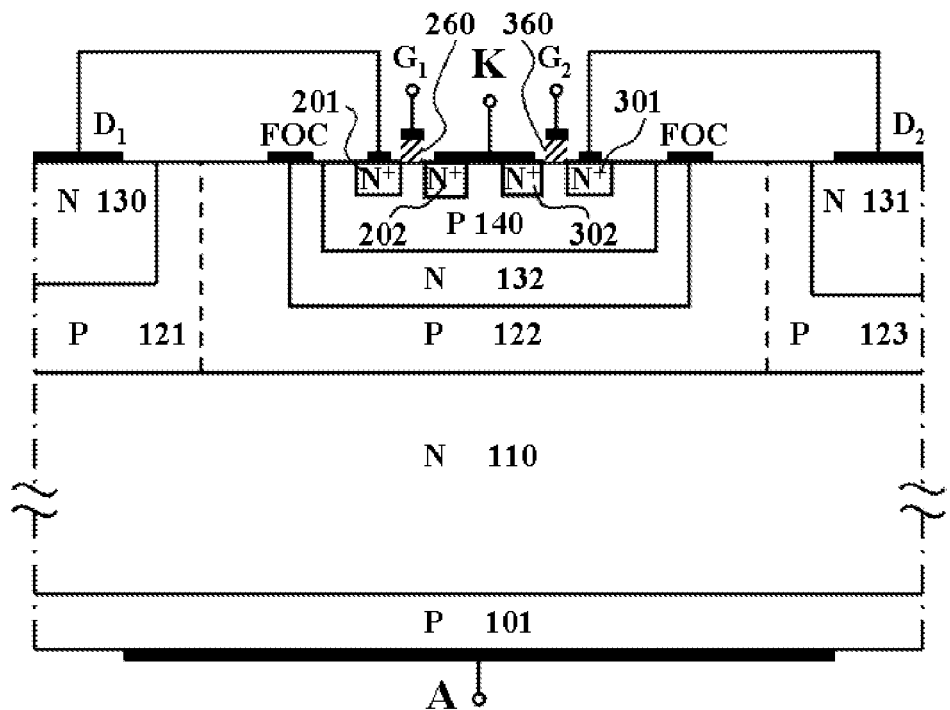
FIG. 6A shows schematically another structure with current sources implemented in the chip.

For the purpose of implementing the two current sources 200 and 300 as shown in FIG. 2, it is not necessary to divide the P-region 120 in this figure into three individual sections, but can connect these sections together, as shown in FIG. 6A. Here, the number of each region is the same with that of FIG. 5. The function of it is not to be repeated. Note that the doping concentration of the P-region 122 can be heavy to reduce its lateral resistance. Thus, the potential of the two sides (P-region 121 and P-region 123) will not be unequal produced by a lateral current.

Figure 6B:
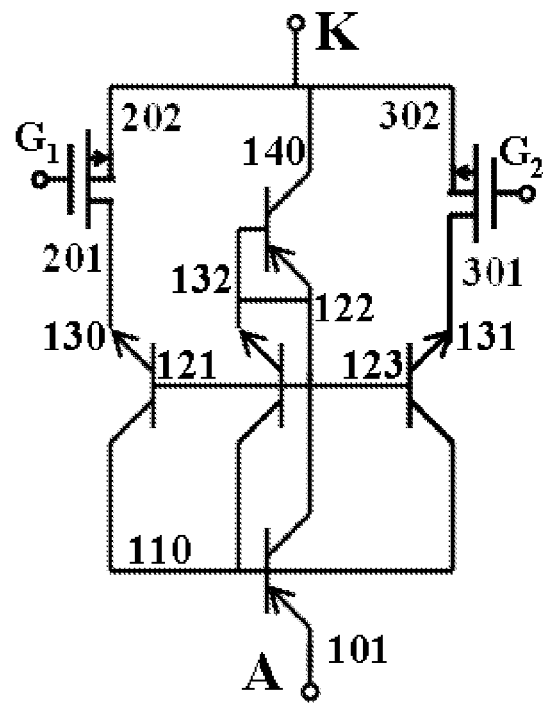
FIG. 6B shows the simple equivalent circuit of FIG. 6A.

FIG. 6B shows the simple equivalent circuit of FIG. 6A.

Figure 7:
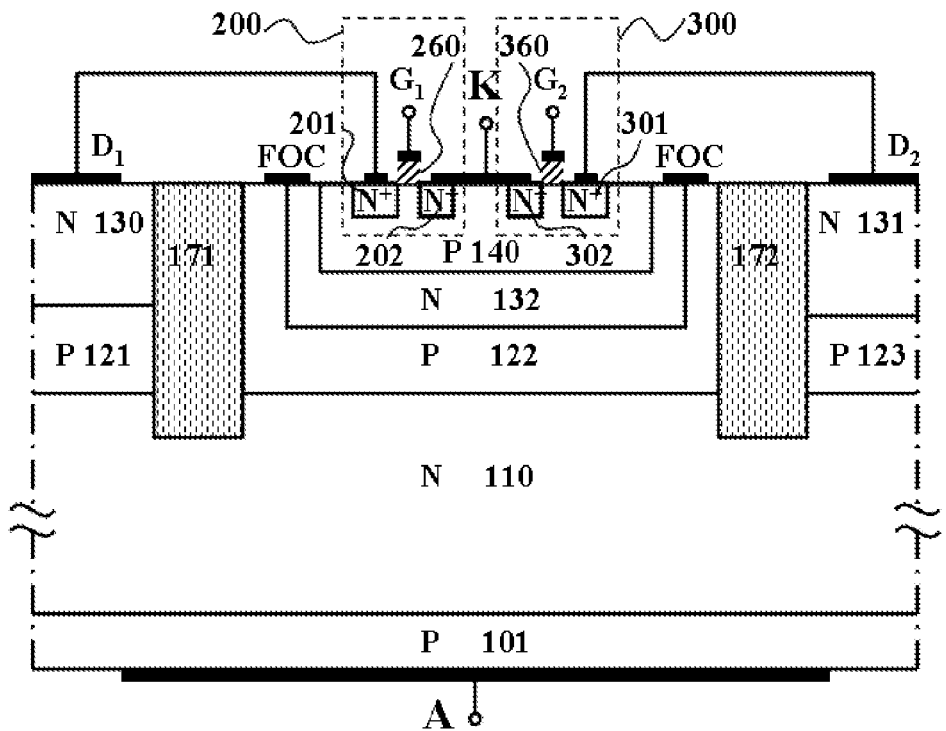
FIG. 7 shows schematically a structure based on FIG. 5A or FIG. 6A by using dielectric isolation.
Figure 8:
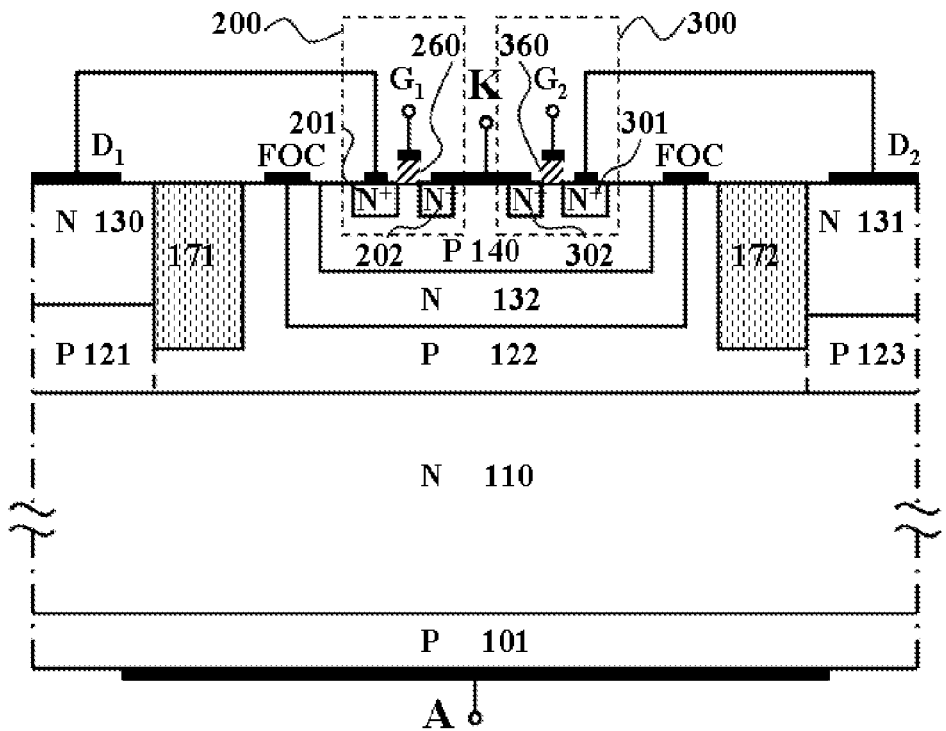
FIG. 8 shows schematically another structure based on FIG. 5A or FIG. 6A by using dielectric isolation.

Needless to say, by utilizing the technique of trench, the N-region 130 and/or the N-region 131 in FIG. 5A or FIG. 6A can be made to be not entirely surrounded by the P-region 121 and/or 123. FIG. 7 schematically shows isolating those three P-regions in FIG. 5A or FIG. 6A completely by using dielectrics 171 and 172. FIG. 8 schematically shows isolating those three P-regions in FIG. 5A or FIG. 6A partially by using dielectrics. In these two figures, only the bottoms of the N-region 130 and N-region 131 are contacted to P-regions and their edges have no P-region surrounded.

Figure 9:
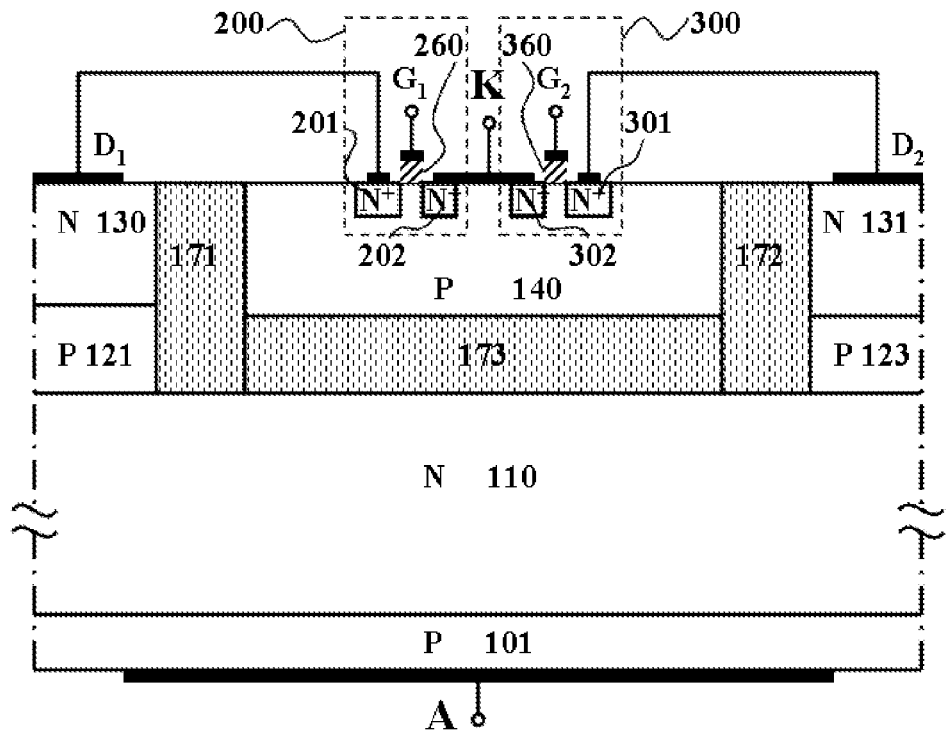
FIG. 9 shows schematically a structure based on FIG. 5A or FIG. 6A by using the technique of SIS.

The two n-MISFETs are used to work as two current sources in FIG. 5A or FIG. 6A due to that n-MISFET needs lower drain-source voltage with the same conduction current, thus conduction loss can be reduced. However, in order to implement the n-MISFET, a P-type source substrate region 140 is required, and this P-region can not be replaced by the P-region 122, otherwise holes injected from the P-region 101 will directly flow into the electrode K through the P-region 122 and the capability of controlling two carriers would be lost. As a consequence, an N-region 132 whose potential is equal to that of the P-region 122 is added. If the current source is implemented in a semiconductor region which is insulated from other semiconductor regions, the N-region 132 does not necessarily being used. FIG. 9 shows a method to isolate the current source region by using insulators 171 and 172 (e.g. using the technique of Trench) at two sides and an insulator 173 (e.g. using the technique of SIS) at the bottom and then the P-region 140 serves as the source substrate region.

Figure 10:
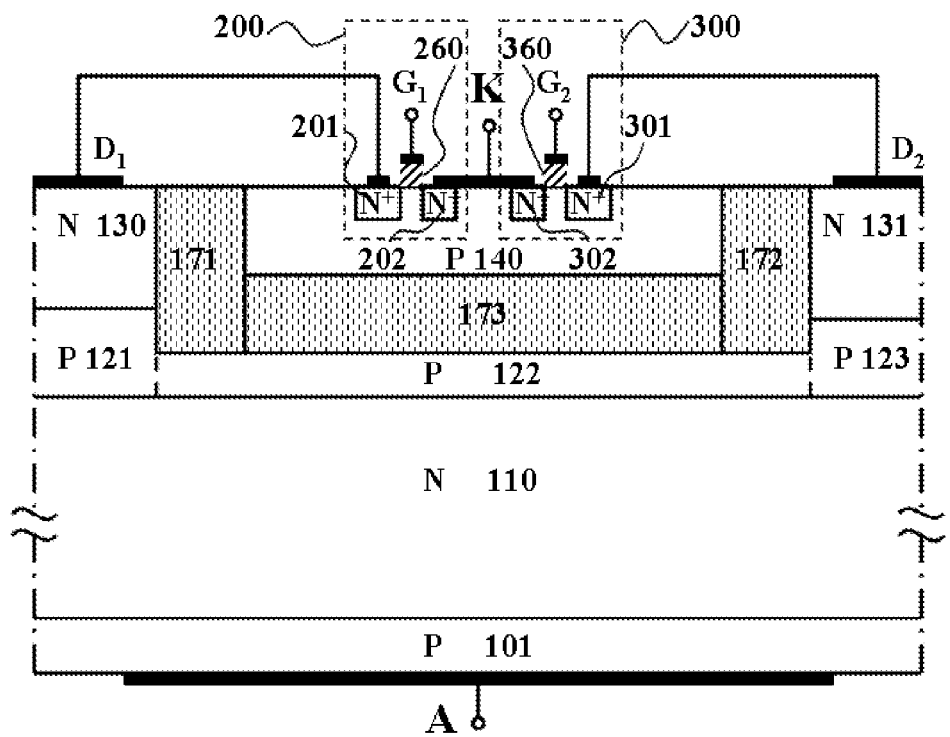
FIG. 10 shows schematically another structure based on FIG. 5A or FIG. 6A by using the technique of SIS.

Naturally, this method has certain flexibility. For example, a part of the P-region 122 can be remained beneath the insulator region, as shown in FIG. 10. Thus, the path of holes, which have flowed through the voltage-sustaining region 110 into the upper layer, can be widened. At the same time, the potentials of the P-regions 121 and 123 are closer, making the electron current density and the hole current density to be closer.

Figure 11A:
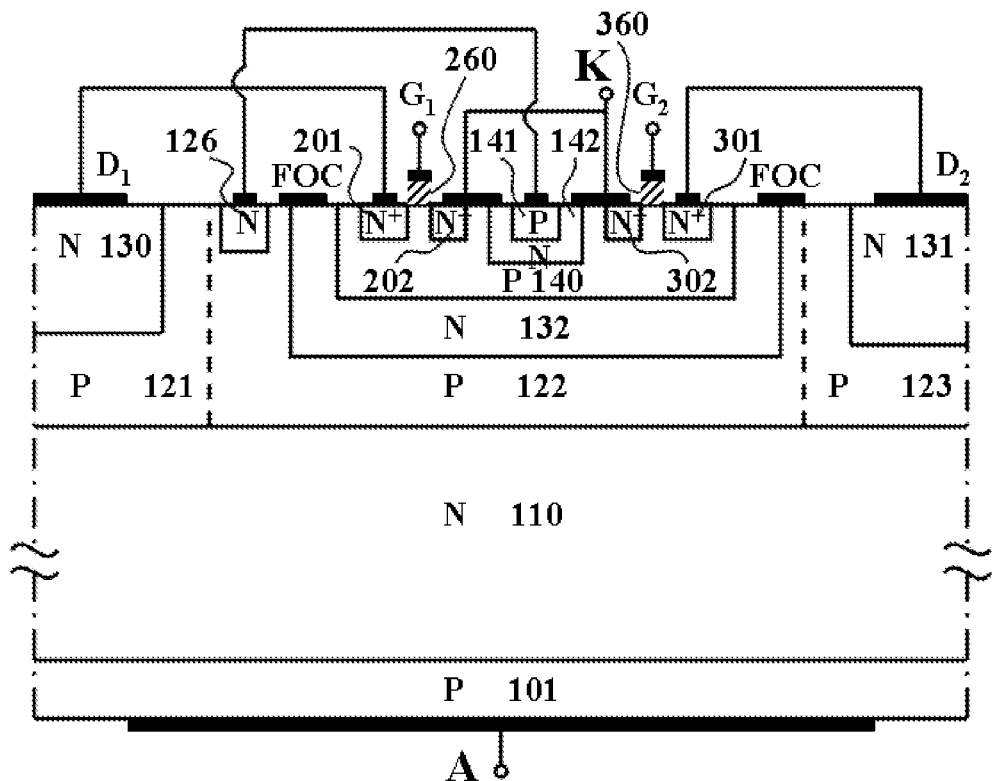
FIG. 11A shows schematically a structure with additional clamping diodes.

FIG. 11A shows a P-N diode composed of the P-region 122 and an N-region 126 which is connected to a P-region 141 through inner connection or outer connection, and the P-region 141 is set in an N-region 142, forming another diode. The N-region 142 is connected with the P-region 140 and the cathode K through a conductor. That is to say, there are two diodes from the P-region 122 to the cathode K. Therefore, although the current flowing from the P-region 122 to K is very large, the voltage across these regions will not exceed the sum of the forward voltage drop of these two diodes ($\approx 1.5V$ for Si devices), which can avoid the drain-source voltage of those two n-MISFETs controlled by $G_1$ and $G_2$ to be too high under large current, in other words, these two diodes play a role of clamping.

Figure 11B:
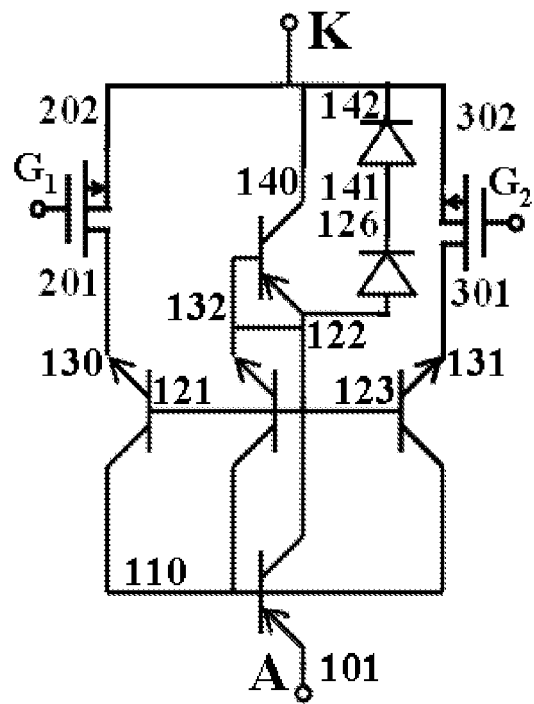
FIG. 11B shows the simple equivalent circuit of FIG. 11A.

FIG. 11B shows the simple equivalent circuit of FIG. 11A.

Figure 12A:
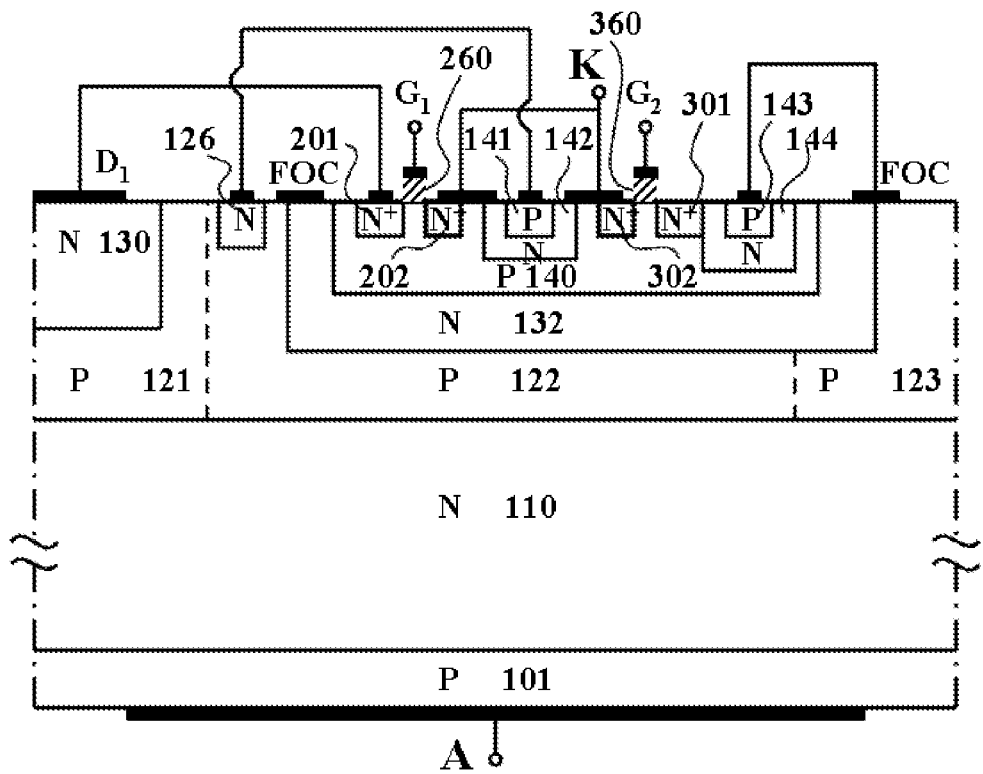
FIG. 12A shows schematically another structure to implement the current source for providing hole current in FIG. 1A and FIG. 2A.
Figure 12B:
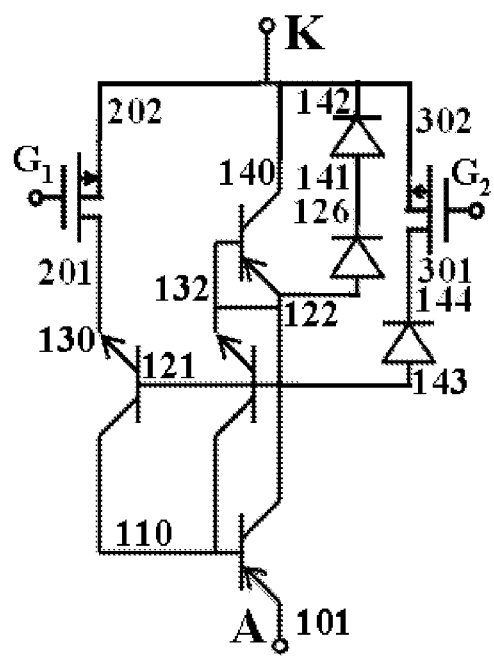
FIG. 12B shows the simple equivalent circuit of FIG. 12A.

There is another implementing method for the current source 300 in FIG. 1 and FIG. 2. The P-N junction originally formed by the P-region 123 and the N-region 131 in these two figures is implemented in the P-region 140 shown in FIG. 5A or FIG. 6A. FIG. 12A schematically shows the structure of this method. In this figure, the drain region of the n-MISFET controlled by $G_2$ is an N-region 144, and a P-region 143 is implemented in the N-region 144, forming a P-N junction. The P-region 143 is connected to the P-region 123 by a conductor through FOC of this figure. The P-region 122 and the N-region 126 constitutes a diode, which is in series connection with another diode formed by the P-region 141 and the N-region 142, acts a function of clamping. FIG. 12B shows the simple equivalent circuit of FIG. 12A.

Although the structures stated above can make the device being conduct, the time making the device from off-state to on-state may be very long. Because the precondition of holes in the P-region 101 injecting into the N-region 110 is that there should have electrons in the N-region 130 flowing through the P-region 121 then into the N-region 110, and eventually into the P-region 101. This requires the voltage across the P-region 120 or 121 and/or 122 and/or 123 and the N-region 131 to be high enough (about 0.7V for Si devices), this voltage is produced in turn by the injection of holes from the P-region 101. Thus, to make the amount of holes in the P-region 120 be sufficient for inducing the regeneration effect of the thyristor needs a long time.

Figure 13A:
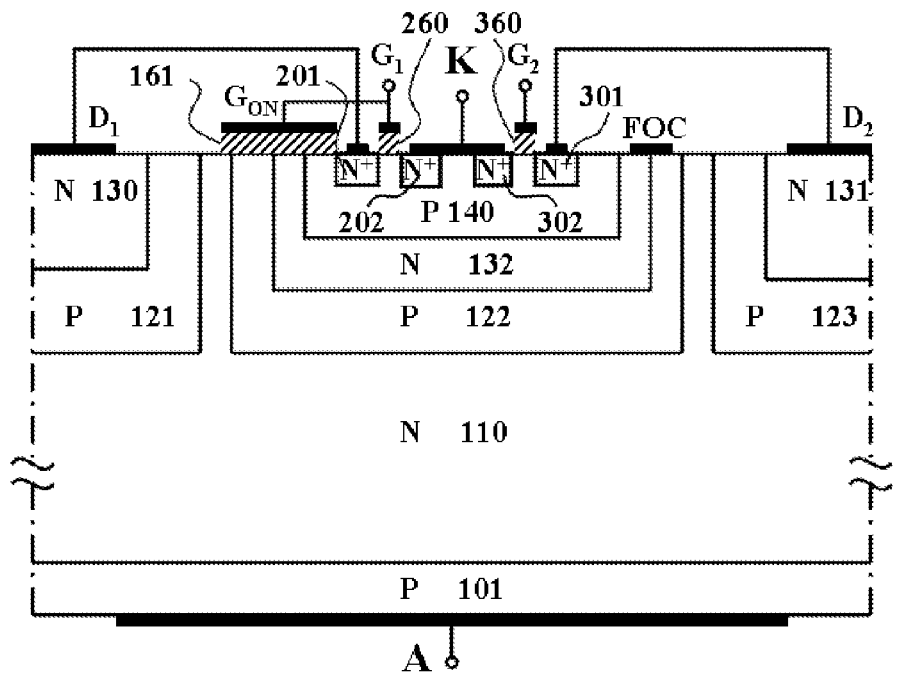
FIG. 13A shows schematically a structure adding a turn-on gate to increase the turn-on speed.
Figure 13B:
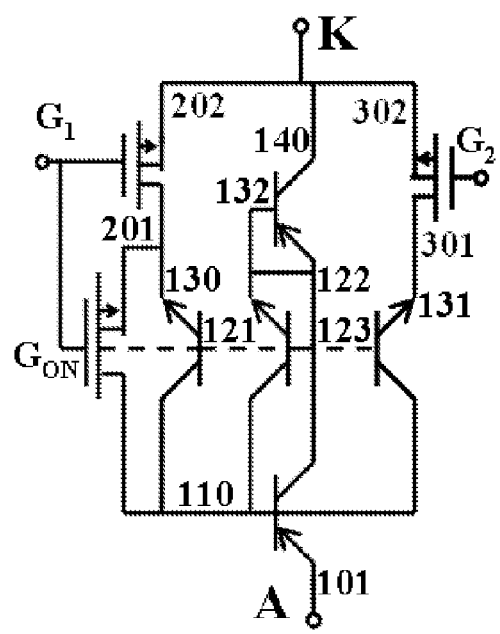
FIG. 13B shows the simple equivalent circuit of FIG. 13A.

To increase the turn-on speed, electrons can be introduced directly to the voltage-sustaining region 110 at the beginning of the turn-on process, instead of through the path from the N-region 130 to the P-region 121. FIG. 13A schematically shows a structure of this method based on the structure of FIG. 5A, but has an additional n-MISFET where the N-region 110 serves as its drain region, and a part of the N$^+$-region 201 serves as its source region. An insulator layer 161 at the surface, with two ends on these two regions and covering on the P-region 122, the N-region 132 and the P-region 140 is made and is in turn covered by a conductor serves as the gate of an n-MISFET, which is called as turn-on gate $G_{on}$. The turn-on gate $G_{on}$ is connected with $G_1$, forming two series n-MISFETs which share a common gate signal. Both $G_{on}$ and $G_1$ are turned on at the primary stage from off-state to on-state, and making electrons flow into the N-region 110. Since these two n-MISFETs are connected in series, the total electron currents are controlled by the gate $G_1$. In the voltage-sustaining region 110, the electron current can be equal to the hole current (controlled by $G_2$) after turned on. FIG. 13B shows the simple equivalent circuit of FIG. 13A.

Figure 14A:
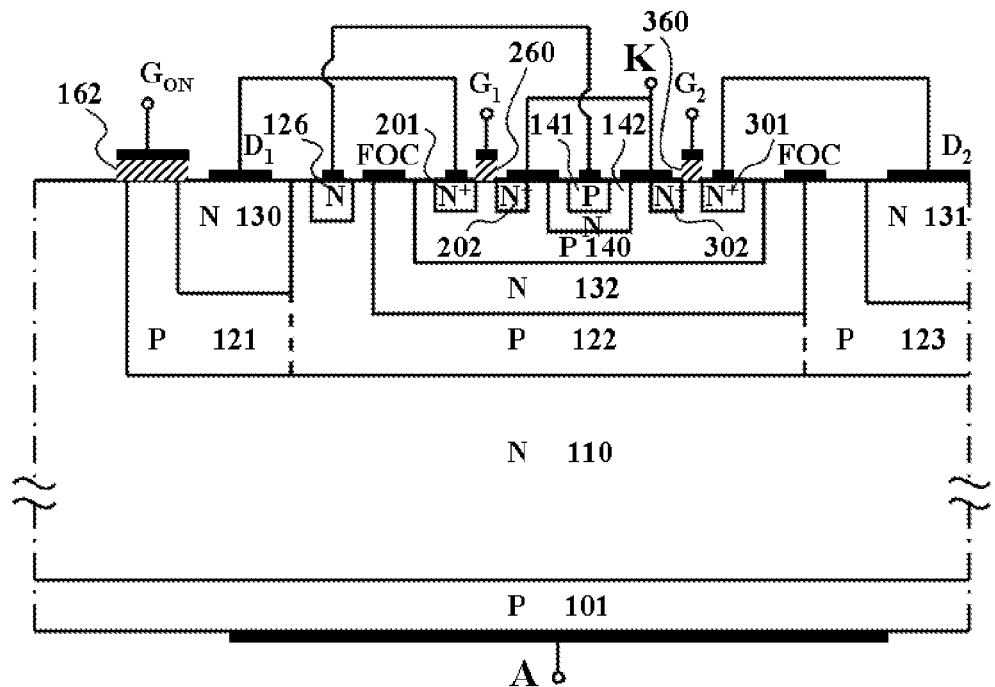
FIG. 14A shows schematically another structure with a turn-on gate to increase the turn-on speed.
Figure 14B:
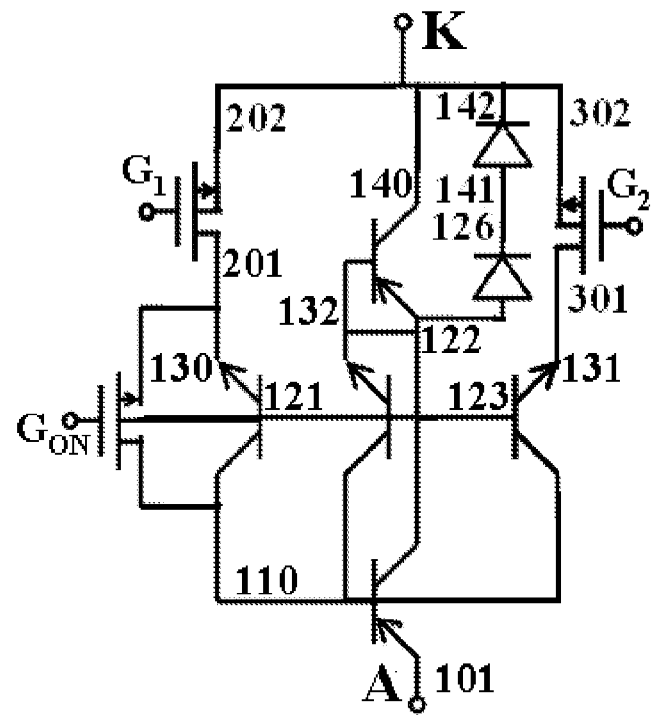
FIG. 14B shows the simple equivalent circuit of FIG. 14A.

In order to speed up the turn-on process further, different gate signals of $G_1$ and $G_{on}$ can be applied, the structure is shown in FIG. 14A. Here, the N-region 130 serves as the source region, the P-region 121 serves as the substrate region, the N-region 110 serves as the drain region of the special turn-on n-MISFET, and an insulator layer 162 covers a part of the N-region 130 to a part of the N-region 110 and it is in turn covered by a conductor serving as a gate electrode $G_{on}$. FIG. 14B shows the simple equivalent circuit of FIG. 14A.

Figure 15A:
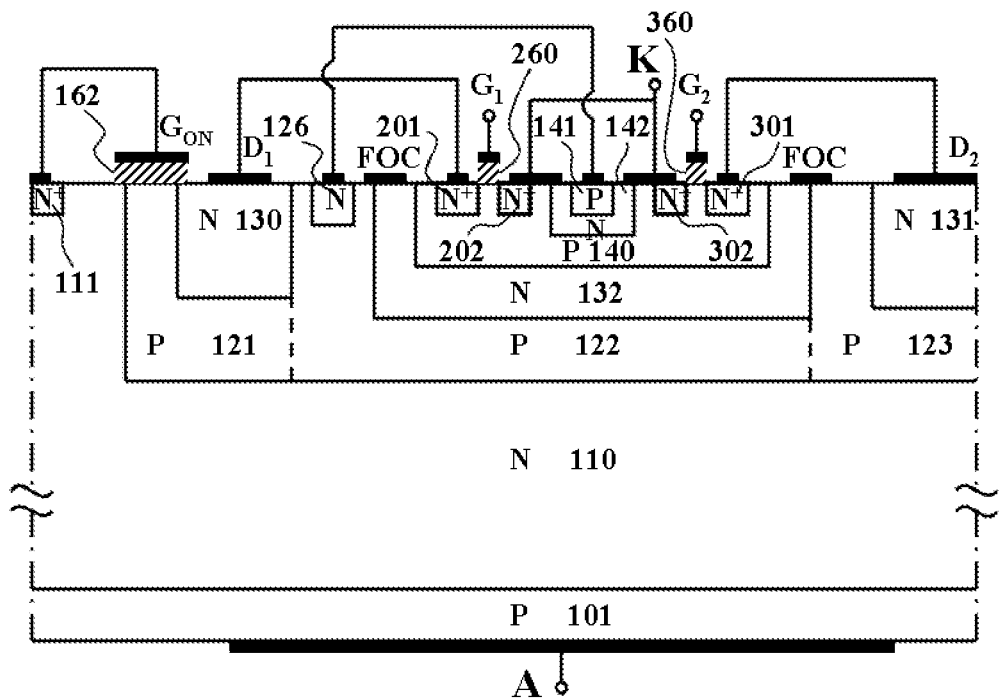
FIG. 15A shows schematically a structure which can achieve fast turn-on by automatically providing the signal of turn-on gate.
Figure 15B:
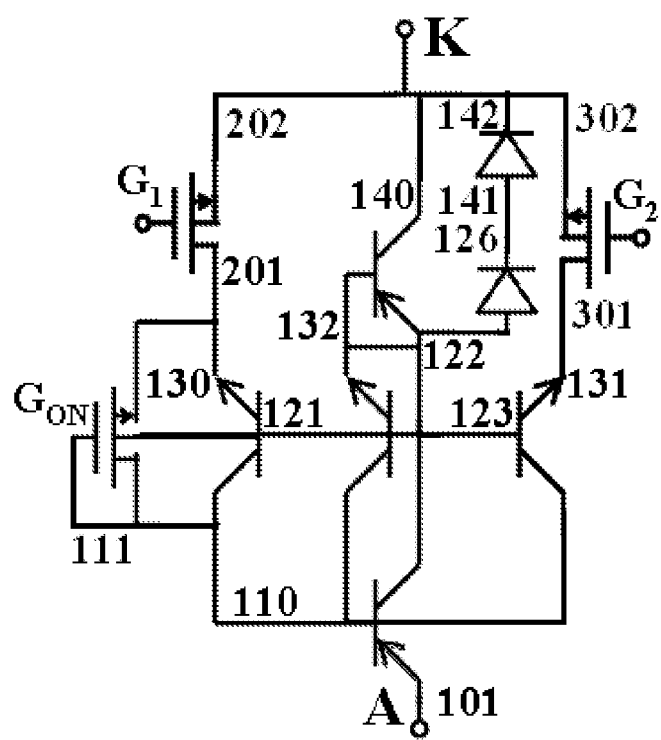
FIG. 15B shows the simple equivalent circuit of FIG. 15A.

A method to obtain the voltage applied to $G_{on}$ is also proposed in the present invention shown in FIG. 15A. Here, an N$^+$-region 111 is implemented in the N-type voltage-sustaining region 110 close to the P-region 121. When $V_{AK}$ is high but current is small, the N$^+$-region 111 is not fully depleted, and a positive voltage with respect to the P-region 121 is induced in the un-depleted region. This un-depleted region is contacted to a conductor which is connected to $G_{on}$ through a conductor. At the beginning of the turn-on process, the n-MISFET controlled by $G_{on}$ remains the on-state. With the decreasing of $V_{AK}$, the voltage drop across the un-depleted region and the P-region 121 decreases and finally makes the n-MISFET controlled by $G_{on}$ turn off. FIG. 15B shows the simple equivalent circuit of FIG. 15A.

In principle, the currents controlled by $G_1$ and $G_2$ can be reduced gradually during the process of turn-off in the present invention. However, such process costs a long time due to the regeneration effect caused by two transistors.

Figure 4A:
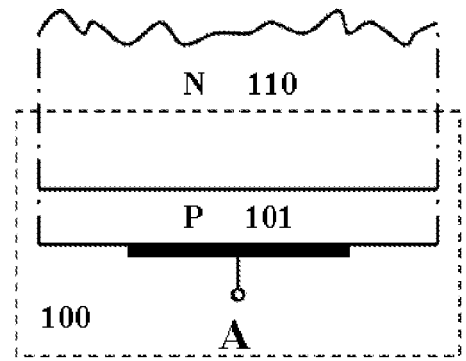
FIG. 4A-4F shows schematically several kinds of structures beneath the voltage-sustaining region.
Figure 4B:
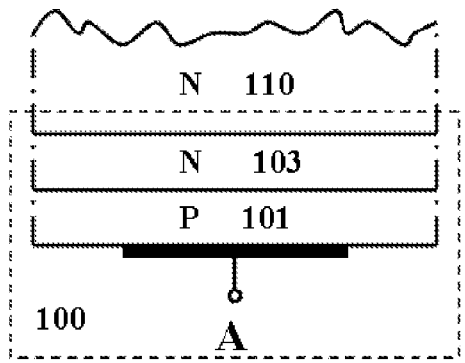
Figure 4C:
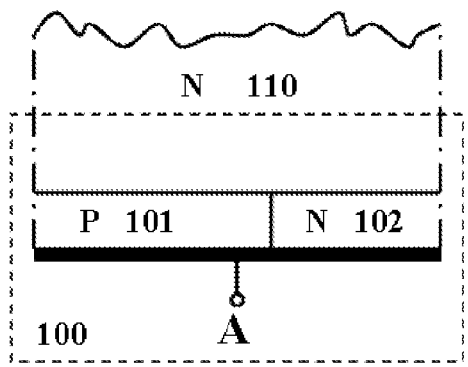
Figure 4D:
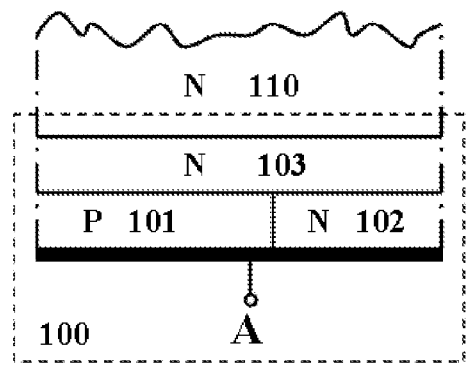
Figure 4E:
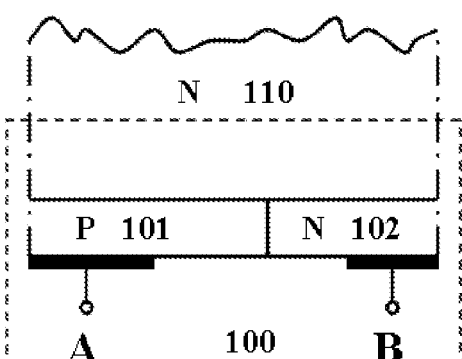
Figure 4F:
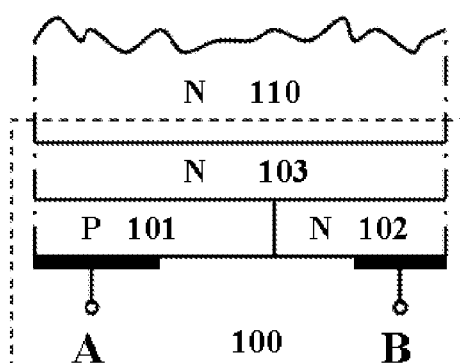

The speed of turn-off can be improved by using anode shorted structure, as shown in FIG. 4C and FIG. 4D. It can be explained by that when the electron current flowing through the N-region 110 is very small, the voltage drop of the P-region 101 with respect to the N-region 102 is very low (e.g. it is lower than 0.5V for Si devices) and there is almost no hole injecting into the N-region 110 from the P-region 101. At that time, the regeneration effect of transistors does not exist.

Figure 16A:
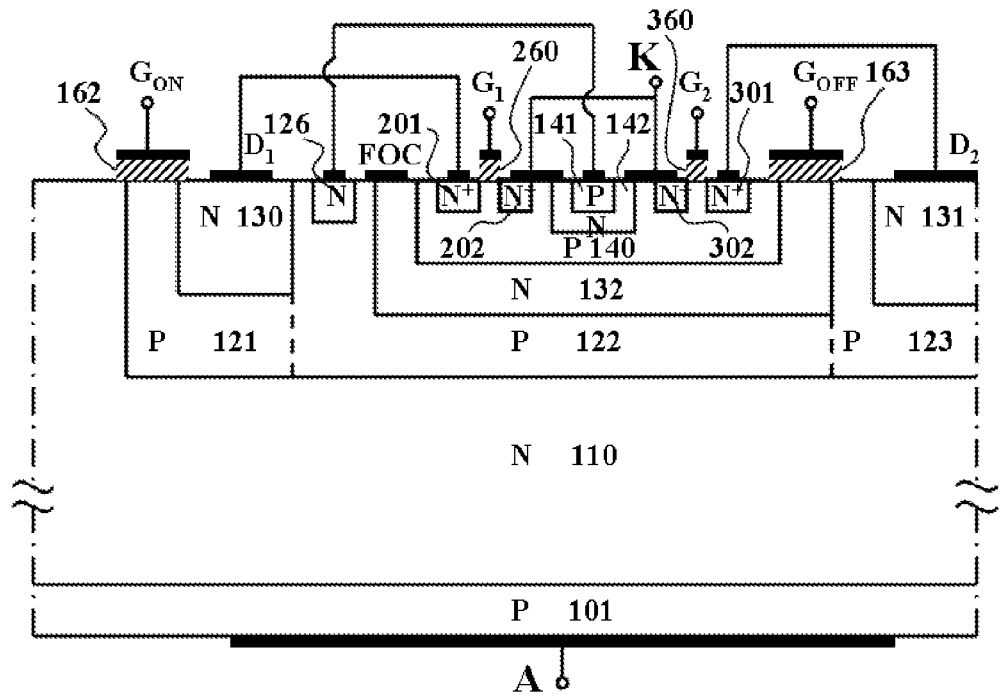
FIG. 16A shows schematically a structure with an additional turn-off gate based on the structure shown in FIG. 14A.
Figure 16B:
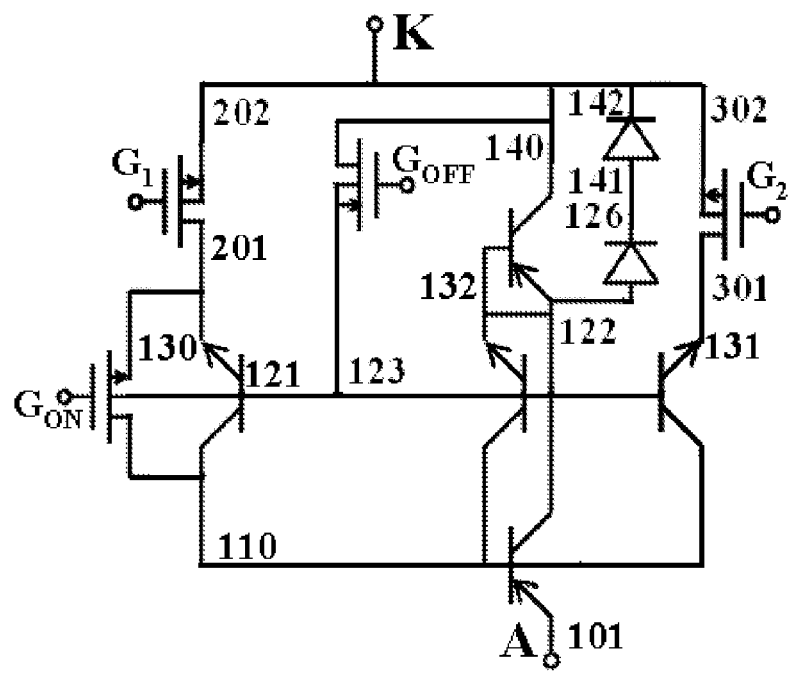
FIG. 16B shows the simple equivalent circuit of FIG. 16A.

However, only when the current is small enough, the voltage drop across the P-region 101 and the N-region 102 can be reduced enough by using anode-short structure. In the present invention, a method for high speed of turn-off is also proposed, which is realized by adding a gate $G_{off}$ used for turn-off FIG. 16A shows schematically a method of adding a turn-off gate $G_{off}$ based on FIG. 14A. An insulator layer 163 covers the top surface of semiconductor. The insulator layer is located from a part of the P-region 123 to a part of the P-region 140 through the N-region 132. A conductor is covered on such an insulator serving as the turn-off gate of a p-MISFET, where the P-region 123, N-region 132 and P-region 140 are the source region, source substrate region and drain region, respectively. When the voltage applied to $G_{off}$ is lower than the threshold voltage, the p-MISFET conducts, making the P-region 123 and P-region 140 conduct. If the voltage drop across the P-region 123 and P-region 140 is lower than the forward voltage drop of a P-N junction (about 0.7V for Si devices), there is almost no current flowing between the P-region 123 and N-region 131. In the same way, there is almost no current flowing between the P-region 121 and N-region 130. The two n-MISFETs controlled by $G_1$ and $G_2$ do not work and the device is equal to a PNP transistor composed of the P-region 101, N-region 110 and P-region 123 (as well as P-regions 121 and 122), which can sustain a very high voltage while nearly with no current. FIG. 16B shows the simple equivalent circuit of FIG. 16A. Obviously, the method to ensure the voltage drop across the P-region 123 and P-region 140 lower than the forward voltage drop of a P-N junction (about 0.7V for Si devices) also can be realized by forming an n-MISFET between the N-region 132 and P-region 140.

Figure 17:
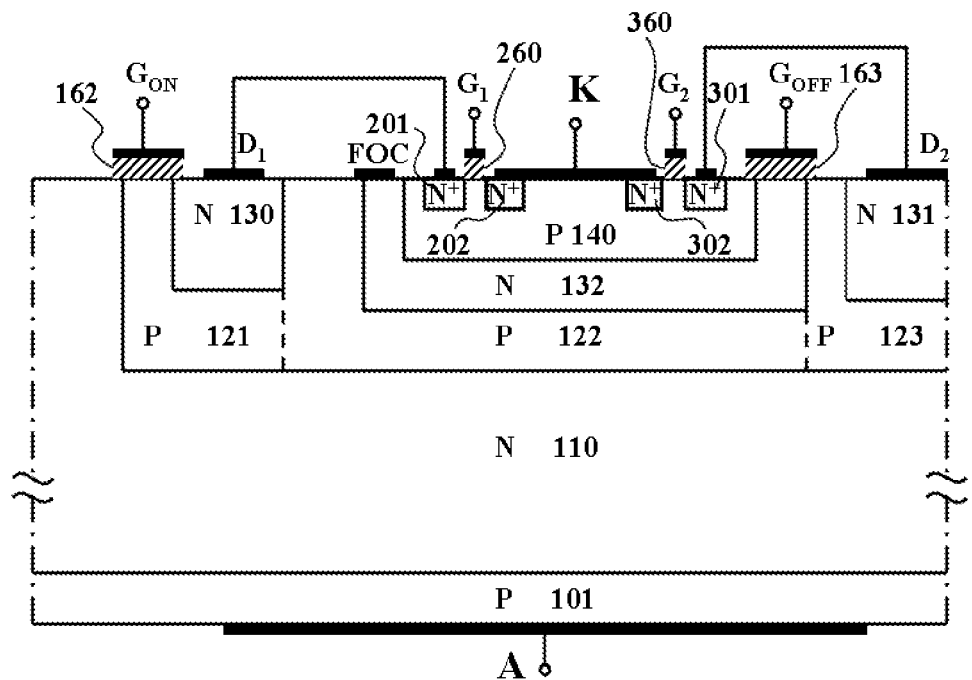
FIG. 17 shows schematically a structure without the clamping diodes based on the structure shown in FIG. 16A.

For the structure shown in FIG. 16A, the two series connected clamping diodes formed by the P-region 122 with the N-region 126 and the P-region 141 and with the N-region 142 are not necessary in practice. Because when the voltage applied to $G_{off}$ is high enough to make the p-MISFET conduct, the potential difference between the P-region 121 (as well as P-regions 122 and 123) and the P-region 140 is already clamped. FIG. 17 schematically shows a structure without clamping diodes.

Figure 18:
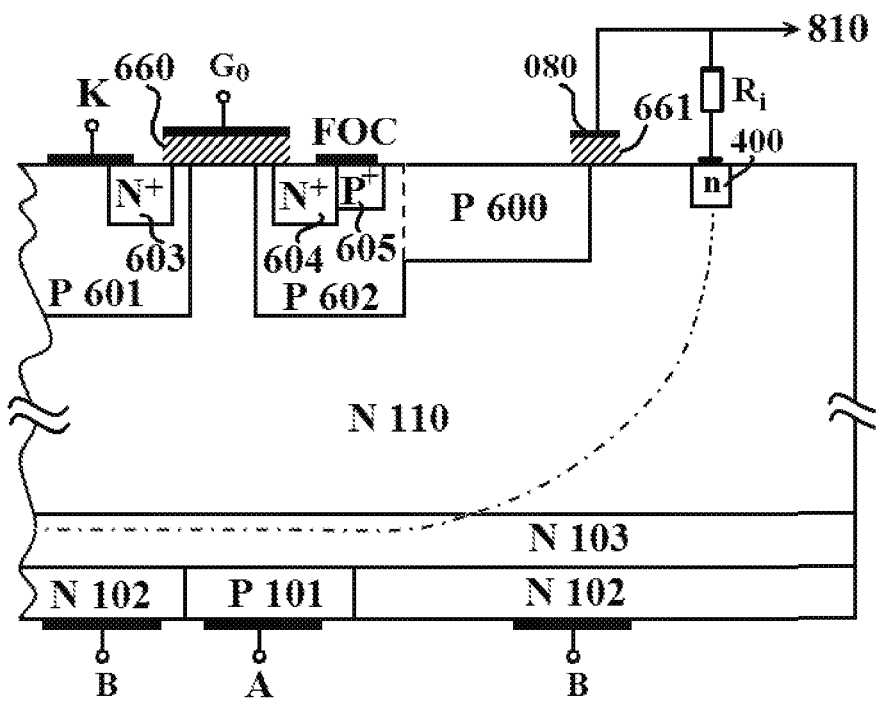
FIG. 18 shows schematically the method to produce a control signal for the low-voltage circuit, according to the FIG. 21 of Ref [1]

Effective methods to increase the turn-off speed have been proposed in a patent (Ref [1]) by this inventor. FIG. 18 shows an example from FIG. 21 of Ref [1] where the numbers marked are changed here. Now, the P-region 602 together with the P-region 600 here serves as voltage-sustaining structures for the junction edge-termination. In the off-state, the voltage-sustaining region starts from the right side of the P-region 601 connected to the electrode K ends at the left side of a heavily doped N-region 400 serving as the field ring. An insulator layer 661 is set on the surface of the right end of the P-region 600 and covered by a conductor 080, which is connected to one terminal of a resistor $R_i$. The other terminal of the resistor $R_i$ is connected to the N-region 400. When a negative pulse signal is applied to the gate $G_0$ of this figure and results in an inversion region in the surface of the N-region 110 beneath the insulator layer 660, the potential of the P-region 602 and P-region 600 is to be closer to that of the electrode K, thus the potential of the region underneath the insulator 661 becomes lower than the value when no negative pulse signal is applied to $G_0$. Then, the capacitor composed of 080 and the surface of semiconductor is to be charged. The charging current starts from 400, via $R_i$ to 080, then to 600 and ends at the electrode K. Therefore, there is a voltage drop across the resistor $R_i$ and a pulse of voltage with respect to the neutral N-region in 110 can be obtained at the terminal 810, which is connected to 080 and $R_i$.

As the function of producing a turn-off signal has been described above, the $N^+$-region 603, the $N^+$-region 604, the $P^+$-region 605 and the FOC in FIG. 18 are not related to the control method above, thus, they are not described here.

Since the output signals with different polarities from 810 can be achieved at or before the moment of turn-on or turn-off, a low-voltage circuit can be triggered by such signals. Such low-voltage circuit can be implemented in the neutral region 800 shown in FIG. 19 located out of the junction edge-termination. The region 810 serves as the input terminal of this circuit, and electrodes A and B serve as the output terminals, which are connected to the electrodes A and B shown in the FIG. 4E, respectively. When the device is turned off, the voltage between the electrode A and B can be reduced to a value lower than the voltage across a P-N junction when it is turned on (about 0.7V, for Si devices), resulting in no holes from the lower surface injecting into the N-region 110.

Figure 19:
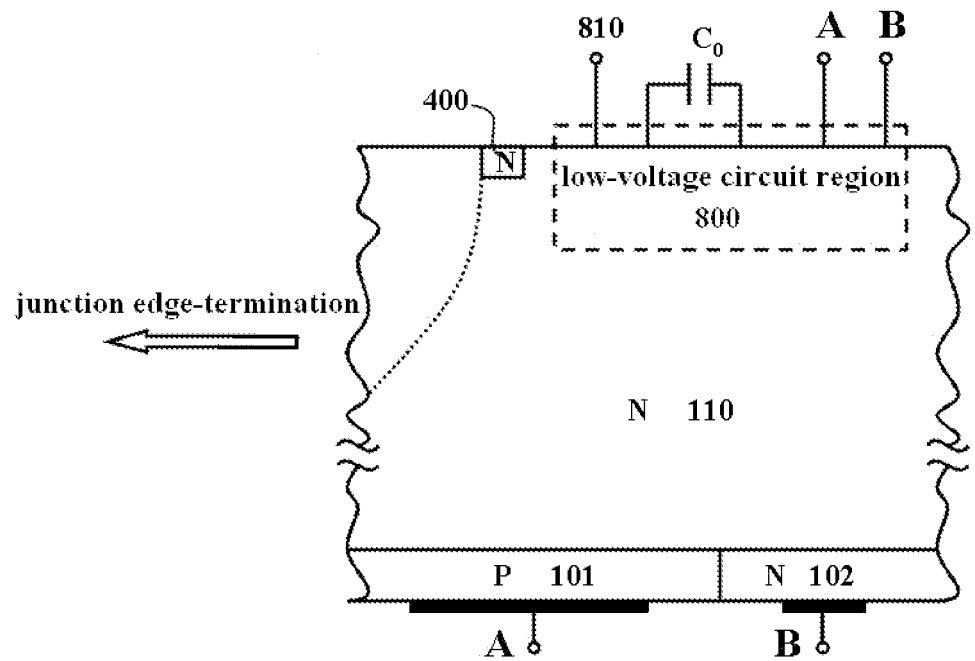
FIG. 19 shows schematically a diagram of the low-voltage circuit to realize anode-short.

The capacitor $C_0$ shown in FIG. 19 represents a power supply for the low-voltage circuit in the region 800. This power supply may not be required for the devices with small current. But for devices with large current, the current between electrodes A and B is very large at the beginning of the turn-off process, therefore, high driving capability is required in the low-voltage circuit and a power supply which can provide large transient current is required.

Figure 20:
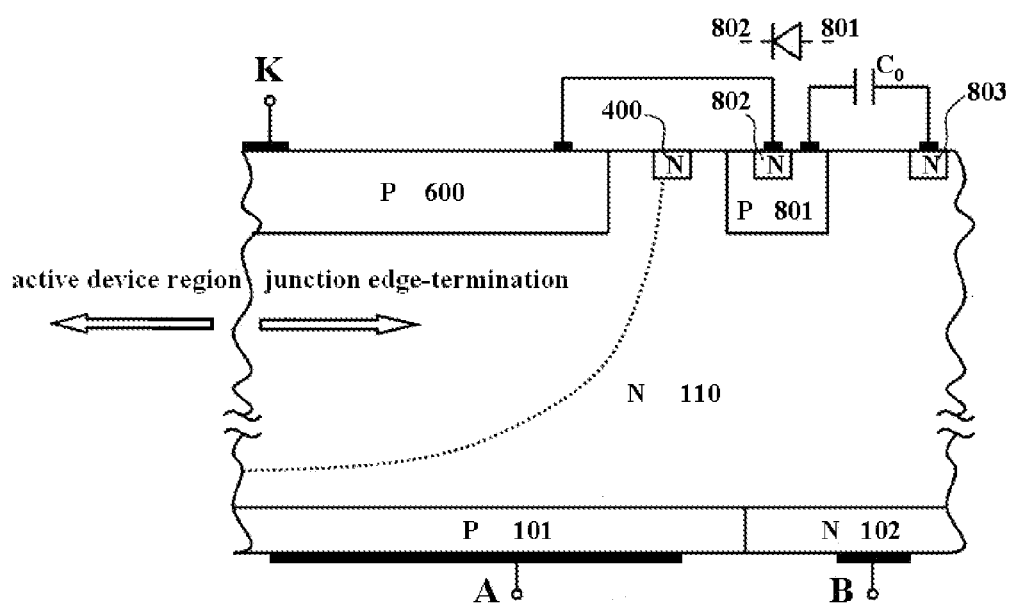
FIG. 20 shows schematically a method to implement the power supply of the low-voltage circuit.

FIG. 20 shows a charging method for $C_0$ of this invention. In this figure, the dashed line stands for the boundary of the depletion region in the N-region 110 when the device is in off-state. A technique of the junction edge-termination can be used in a part of the P-region 600. Such technique can be, e.g., realized by the technique of OPTimum Variation Lateral Doping (OPTVLD) described in Ref [2]. There is a conductor contacted with a part of the P-region 600 located close to the boundary of the depletion region. Such conductor is connected to the N-region 802 surrounded by the P-region 801 in a neutral region. One terminal of $C_0$ is connected to the P-region 801, and the other terminal is connected to the $N^+$-region 803 in the neutral region of the N-region 110. When $V_{AK}$ is very large (e.g., when the device is in off-state), there is a current flowing from the $N^+$-region 803 to $C_0$, then through the P-N junction formed by the P-region 801 and N-region 802, and then through 600 and eventually into the electrode K, and the capacitor $C_0$ is then being charged. The charging process stops when the voltage drop across the capacitor reaches a certain value. So, the capacitor $C_0$ can be used as the power supply of the low-voltage circuit. The diode formed by the P-region 801 and N-region 802 in this figure prevents an automatic discharging of $C_0$ when this power supply is not used.

Low-voltage power supplies are also wanted for capacitors between two gates $G_1$ and $G_2$ and the surface of semiconductor, controlling the two n-MISFETs during the process of turn-on and/or turn-off. Because the two gates consume a large amount of power, it is best to get a positive voltage with respect to the electrode K from the device itself, so that external power consumption can be saved. In addition, during the process from off-state to on-state, if the voltage of the P-region 121 is positive with respect to the N-region 130 and negative to the N-region 110, it will assist the electrons to flow into the N-region 110 and then into the P-region 101. This requires that the voltage of the P-region 121 should be positive with respect to the electrode K. In this invention, a method for producing a positive voltage with respect to the electrode K by the device itself is also proposed.

Figures 21A, 21B:
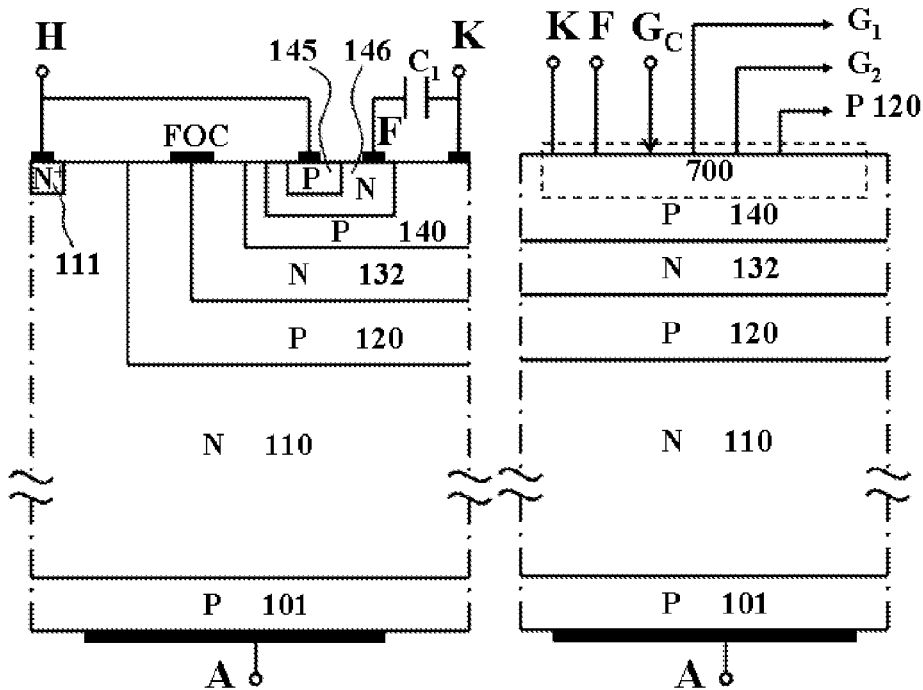
FIG. 21A shows schematically a method to obtain a positive power supply with respect to the cathode by the device itself.
FIG. 21B shows schematically the diagram of the control circuit.

FIG. 21A shows such a method. There is a heavily doped N$^+$-region 111 in the surface of the N-region 110 (see Ref [3]), which has an electrode H contacted on the surface. A P-region 145 is implemented in an N-region 146 and this P-region is connected to H through a wire. An electrode F covering on the surface of N-146 is formed and a capacitor $C_1$ is connected between the electrode F and K. When $V_{AK}>0$, electrons can flow from the N$^+$-region 111 into the N-region 110, then to the bottom. In other words, there is a current starting from the bottom into the N$^+$-region 111, then through the P-N junction formed by 145 and 146, then through the electrode F to the capacitor $C_1$ and eventually to the electrode K, charging the capacitor $C_1$. Note that, no matter which structure shown in FIG. 4 is used in the bottom, it is impossible for hole current to flow constantly into the electrode K in this figure. This is because, the P-region 140 connected with the electrode K is surrounded by the N-region 132, and the latter is connected to the P-region 120 through the FOC at the surface. When the P-region 120 is charged by positive charges, the voltage drop across the P-N junction formed by the N-region 132 and P-region 140 is negative and this P-N junction is reverse biased. In addition, the voltage drop across the P-N junction formed by the N-region 146 and P-region 140 is negative after $C_1$ is charged.

Further, those skilled in the art can easily recognize that the capacitor in the present invention is not limited to be an external one, but can also be implemented in the chip, e.g. by forming a CIC capacitor.

The required gates voltage of $G_1$ and $G_2$ and the positive voltage of the P-region 121 (and P-regions 122 and 123) with respect to K discussed above can be easily obtained by applying external control signal due to that a positive power supply with respect to the electrode K can be realized inside the device. FIG. 21B schematically shows this. In this figure, there is a P-region 140 on the N-region 132 which is implemented on the P-region 120 (represents P-regions 121 or 122 or 123 or other regions like these), and a conventional low-voltage circuit can be implemented in the P-region 140. This low-voltage circuit has a power supply which is realized by connecting with the electrode K and F through wires. The output terminals of the low-voltage circuit can be applied to $G_1$ and $G_2$. Another use of the low-voltage circuit is to connect an output terminal with the P-region 120 for helping turn-on and/or turn-off the device faster. The voltages of these output terminals are controlled by an external signal from an input terminal $G_e$.

Figure 22:
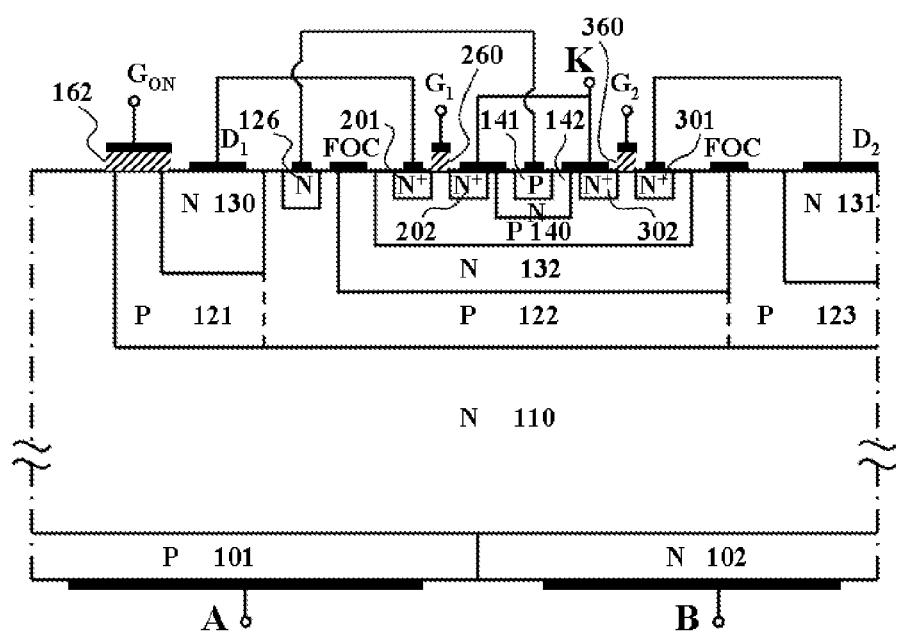
FIG. 22 shows a schematic diagram of FIG. 14A, FIG. 14B by using the structure in FIG. 4E.

A simulation result of the device shown in FIG. 22 is given in the following description. In this figure, the structure is the one shown in FIG. 14A, the bottom of which is implemented by using the anode-short shown in FIG. 4E. The interdigitated layout is applied and the impurity concentration [cm$^{-3}$], width [μm] and thickness [μm] of each region are given as below. For 110 region: $1\times10^{14}$, 57, 300; for 101 region: $3\times10^{18}$, 40, 2; for 102 region: $1\times10^{19}$, 17, 2; for 121 region: $5\times10^{16}$, 20, 10; for 122 region: $1\times10^{17}$, 17, 10; for 123 region: $5\times10^{17}$, 13, 10; for 130 region: $3\times10^{17}$, 10, 2; for 131 region: $2\times10^{16}$, 10, 7; for 132 region: $1\times10^{17}$, 15, 4; the distance between the region 201 and region 202 is 0.3, the thickness of the region 260 is 0.03; the distance between the region 301 and region 302 is 0.3, the thickness of the region 360 is 0.03; the threshold voltage of both n-MOSs are 3V; the distance between the region 110 and region 130 beneath the region 162 is 5, the thickness of the region 162 is 0.03 and the threshold voltage of the n-MOS controlled by $G_{ON}$ is 1.4V. Models such as SRH, CONMOB, FLDMOB, IMPACT.I are used in the simulation, and both of lifetimes of the two types of carrier are set as 200 μs.

Figure 23:
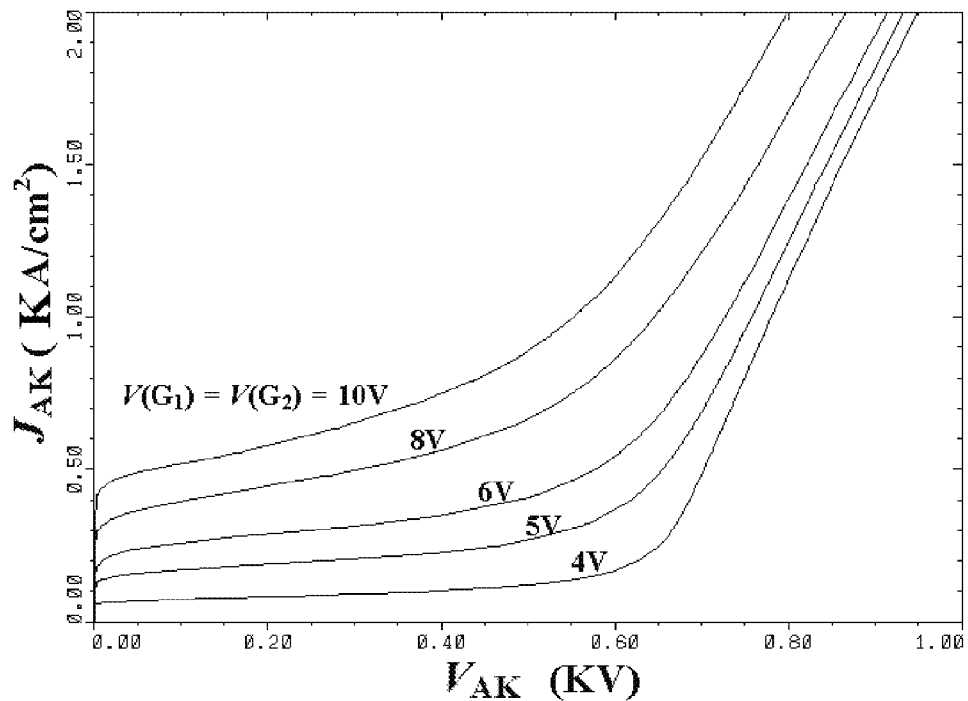
FIG. 23 shows the DC characteristic of the cell structure in FIG. 22, simulated by using TMA-MEDICI package.

FIG. 23 shows the DC characteristic. Under the current density of the device $J_{AK}=200$ A/cm$^2$, the on-state voltage is 1.35V. The breakdown voltage of the device is 1300V (at the condition that the anode-short is used and the voltages of the three gates are equal to the one of the electrode K).

Figure 24:
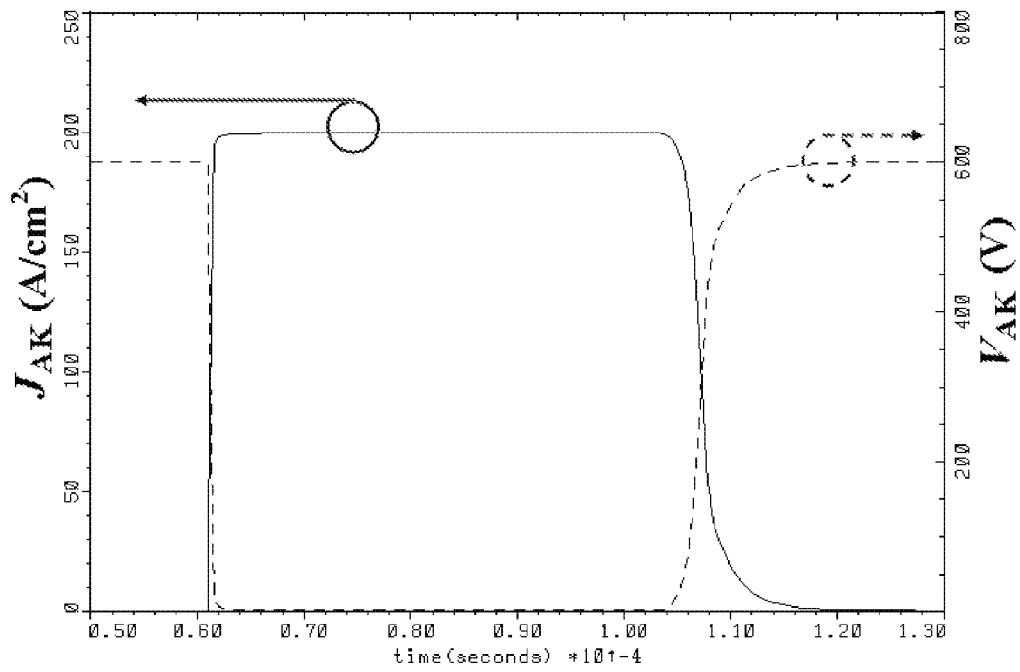
FIG. 24 shows the switching characteristic of the cell structure in FIG. 22, simulated by using TMA-MEDICI package.

FIG. 24 shows the switching characteristics simulated by using TMA-MEDICI package. According to this figure, the turn-on time is 0.45 μs (taken for the current to rise from 10% to 90%) and the turn-off time is 4 μs (taken for the current to fall from 90% to 10%).

Here, for the sake of convenience, an n-MOS is added between the electrodes A and B to replace the structures shown in FIGS. 18, 19, 20. To turn on the device, the values of $V(G_{ON})$ and $V(G_1)$ are firstly increased simultaneously from 0V to 10V linearly in 0.1 μs, then after 20 μs the value of $V(G_2)$ is increased linearly from 0V to 10V in 3 μs. In the turn-off process, the electrodes A and electrode B are shorted in 0.1 μs at the beginning, at the same time, the value of $V(G_{ON})$ is decreased linearly from 10V to 0V in 0.1 μs, then, after 1 μs the values of $V(G_1)$ and $V(G_2)$ are decreased linearly from 10V to 0V in 10 μs.

From the simulation results indicated above, the performance of the device has been better than the product SIGC156T120R2C (manufactured by Infineon, with current density smaller than 63 A/cm$^2$, and on-state voltage 2.5V) and the current density of the present device is larger with the same on-state voltage. It should be noted that the design provided here is not an optimum one.

It is important to point out that the most likely reason to cause power devices failure is the current crowding effect. From the DC characteristic shown in FIG. 23, it can be understood that for the device proposed in this invention, an increasing of $V_{AK}$ or the gate voltage in any local cell causes larger current, but not uncontrollable, and electrical breakdown will not happen even with a high voltage of $V_{AK}$.

Figure 25A:
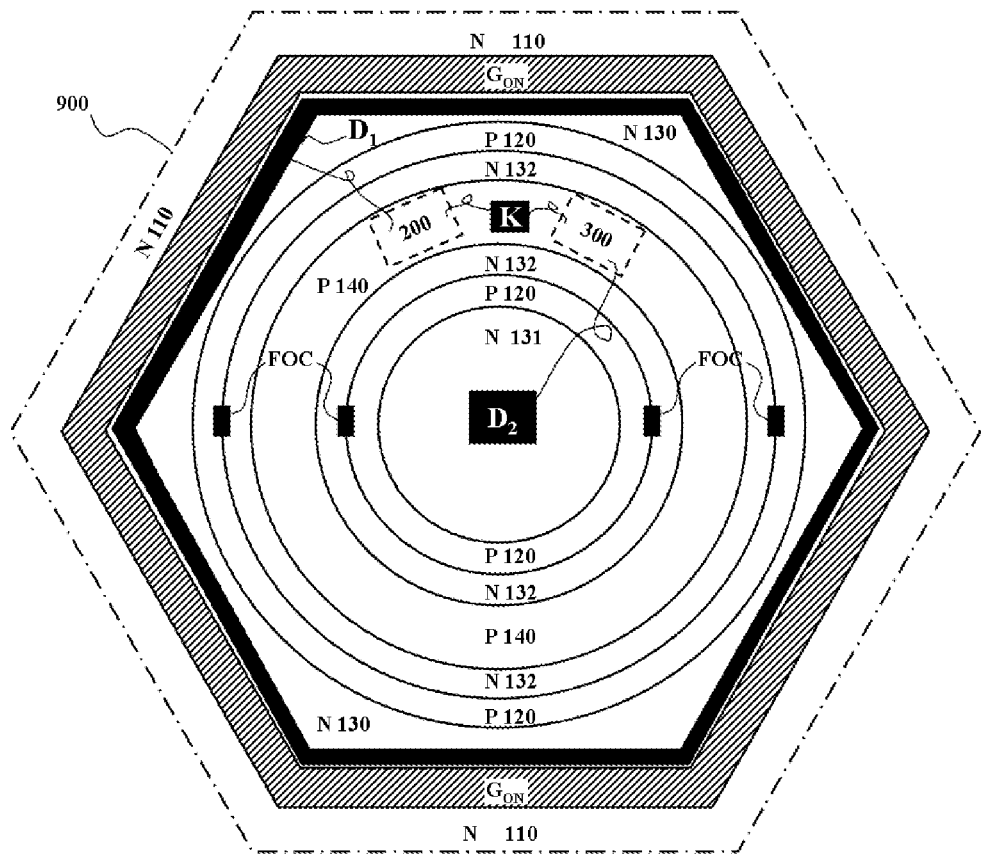
FIG. 25A shows schematically a cell of hexagonal structure.
Figure 25B:
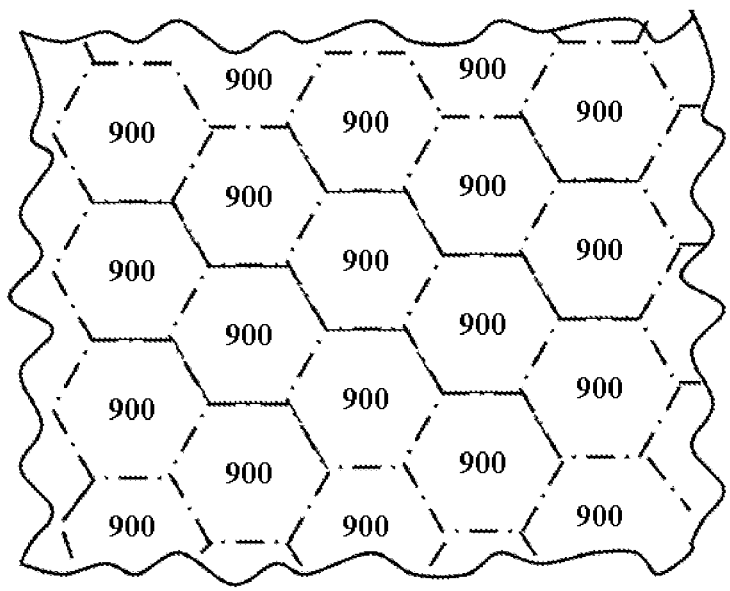
FIG. 25B shows schematically the close-packed structure of the cells shown in FIG. 25A.

The structures of the cell described above also can be designed to other patterns besides the interdigitated layout. FIG. 25A schematically shows a pattern of hexagonal cell, wherein the N-region 110 exposed to the surface is designed at the edge of the cell to obtain a large turn-on capability. FIG. 25B schematically shows the close-packed of such cells.

Although an N-region is used to serve as voltage-sustaining region in the above description, it is evident that a P-region can be used to substitute the N-region as voltage-sustaining region. In that case, all of the N-regions and P-regions described above should be exchanged each other and electrodes A and K should also be exchanged.

Some examples of the present invention have been illustrated above. It should be understood that various other examples of application, which should be included in the scope of the present invention as defined in the claims, will be apparent to those skilled in the art.

Although the invention has been described and illustrated with reference to specific embodiments thereof, it is not intended that the invention be limited to these illustrative embodiments. Those skilled in the art will recognize that modifications and variations can be made without departing from the spirit of the invention. The object of choosing and describing the examples of the application of the present invention is for better explanation of the theory and practical applications. Apparently, the examples chosen above are for those skilled in the art to understand the present invention and thus be able to design various applications with various modifications for special utilizations.

What is claimed is:

1. A semiconductor device, wherein an operation region of said device is located between a first main surface and a second main surface of a semiconductor, comprising at least one cell of a first kind and/or at least one cell of a second kind and/or at least one cell of a third kind;
wherein said cell of said first kind comprises:
a first semiconductor region of a first conductivity type;
one side of said first semiconductor region of a first conductivity type is contacted to a first semiconductor region of a second conductivity type;
another side of said first semiconductor region of a first conductivity type is contacted to one side of a second semiconductor region of a second conductivity type;
another side of said second semiconductor region of a second conductivity type has at least a portion being contacted with a second semiconductor region of a first conductivity type;
wherein said second semiconductor region of a first conductivity type is connected with a first terminal of a first controlled current source; said second semiconductor region of a second conductivity type has another portion being connected to a first terminal of a second controlled current source directly or indirectly through another second semiconductor region of a first conductivity type inside of said another portion or indirectly through a semiconductor region of a second conductivity type;
both second terminals of said controlled current sources are connected with a first conductor, which is a first electrode;
wherein said second main surface has either of two connection methods:
a first connection method is that only a second conductor is connected with said first semiconductor region of a second conductivity type, said second conductor is a second electrode; a second connection method is that besides said second conductor, there is a third conductor, connected with said first semiconductor region of a first conductivity type, said third conductor is a base electrode;
said first controlled current source controls a current of carriers of first type flowing through said first semiconductor region of a first conductivity type, said second controlled current source controls a current of carriers of second type flowing through said first semiconductor region of a first conductivity type; a current through said first electrode to said second electrode is controlled by both said two current sources;
wherein said cell of said second kind has not only the features of said cell of said first kind, but also has features wherein a portion of said first semiconductor region of a first conductivity type is contacted directly to a portion of said first main surface and is covered by a first insulator layer, said first insulator also covers on a place of said second semiconductor region of a second conductivity type and a place of said second semiconductor region of a first conductivity type on said first main surface, said first insulator layer is covered by a conductor; said portion of said first semiconductor region of a first conductivity type which is contacted directly to said first main surface and said second semiconductor region of a first conductivity type serve as a drain region and a source region of an Insulated-Gate Field-Effect Transistor of a first conductivity type, respectively, said second semiconductor region of a second conductivity type serves as a source-body region, said conductor covering on said first insulator serves as a gate of said Insulated-Gate Field-Effect Transistor of a first conductivity type, a signal applied on said gate controls a current of a first conductivity type between said drain and said source of said Insulated-Gate Field-Effect Transistor of a first conductivity type;
wherein said Insulated-Gate Field-Effect Transistor is called as IGFET;
wherein said cell of said third kind has not only the features of said cell of said first kind, but also has features wherein one side of said second semiconductor region of a second conductivity type is covered by a second insulator layer, said second insulator layer also covers one side of a semiconductor region of a second conductivity type serving as junction edge termination region outside of an edge of an active region; said junction edge termination region starts from a first side and ends at a second side; said first side is at said edge of said active regions of semiconductor devices, said second side has a feature that a neutral region of said first semiconductor region of a first conductivity type is at a place outside of said second side where no electric field exists under a voltage applied across said first electrode and said second electrode; a conductor covers on said second insulator layer serving as a turn-off gate; a low-voltage circuit is implemented outside of said second side of said junction edge termination region; said low-voltage circuit has two output terminals: a first terminal is connected with said second electrode and a second terminal is connected with said base electrode;
wherein said low-voltage circuit outside said junction edge termination region has two input terminals, wherein a first input terminal is connected to said neutral region, a second input terminal is connected to a portion in said junction edge termination region but close to said second side, said second input terminal serves as a controlling terminal of said low-voltage circuit,
when a pulse signal is applied to said turn-off gate, a current can flow between said two output terminals of said low-voltage circuit with a variation of a voltage drop between said two output terminals;
when said region of a first conductivity type is an N-type region, then said carrier of a first type is electron, said region of a second conductivity type is a P-type region and said carrier of a second type is hole; when said region of a first conductivity type is a P-type region, then said carrier of a first type is hole, said region of a second conductivity type is an N-type region and said carrier of a second type is electron.

2. The semiconductor device according to claim 1, wherein said base electrode is connected to said second electrode, not connected to said second output terminal of said low-voltage circuit.

3. The semiconductor device according to claim 1, wherein said second semiconductor region of a second conductivity type is divided into three portions isolated one to another by said first semiconductor region of a first conductivity type; each portion has its own second semiconductor region of a first conductivity type surrounded individually by each portion of said second semiconductor region of a second conductivity type and said first main surface; wherein, in a first portion, a dose of doping of said second semiconductor region of a first conductivity type is larger than a dose of doping of first portion of said second semiconductor region of a second conductivity type; in a second portion, a dose of doping of said second semiconductor region of a first conductivity type is smaller than a dose of doping of second portion of said second semiconductor region of a second conductivity type; wherein said second semiconductor region of a second conductivity type in third portion is connected with its own second semiconductor region of a first conductivity type by using a conductor; a third semiconductor region of a second conductivity type is surrounded by said second semiconductor region of a first conductivity type of said third portion and said first main surface, said third semiconductor region of a second conductivity type contains at least two IGFETs of a first conductivity type; all source regions of said IGFETs of a first conductivity type are connected through said first conductor to said third semiconductor region of a second conductivity type; at least two drain regions of said IGFETs of a first conductivity type are connected with said second semiconductor regions of a first conductivity type of said first portion and of said second portion, respectively; at least two insulator layers are formed on said first main surface, each of them covers on a part of each drain region, a part of each source region and a source-body region of each IGFET, respectively; each said insulator layer is covered by a conductor serving as a gate of each said IGFET of a first conductivity type, said gates control currents of said IGFETs of a first conductivity type serving as said controlled current sources of said carriers of two types.

4. The semiconductor device according to claim 1, wherein said second semiconductor region of a second conductivity type is divided into three portions isolated one to another by trenches filled with insulators; each portion has its own second semiconductor region of a first conductivity type surrounded individually by each portion of said second semiconductor region of a second conductivity type and said first main surface; wherein in a first portion, a dose of doping of said second semiconductor region of a first conductivity type is larger than a dose of doping of first portion of said second semiconductor region of a second conductivity type; in a second portion, a dose of doping of said second semiconductor region of a first conductivity type is smaller than a dose of doping of second portion of said second semiconductor region of a second conductivity type; wherein said second semiconductor region of a second conductivity type in third portion is connected with its own second semiconductor region of a first conductivity type by using a conductor; a third semiconductor region of a second conductivity type is surrounded by its own second semiconductor region of a first conductivity type and said first main surface, said third semiconductor region of a second conductivity type contains at least two IGFETs of a first conductivity type; all source regions of said IGFETs of a first conductivity type are connected through said first conductor to said third semiconductor region of a second conductivity type serving as a source-body region of both two IGFETs of a first conductivity type; at least two drain regions of said IGFETs of a first conductivity type are connected with said second semiconductor regions of a first conductivity type of said first portion and of said second portion, respectively; at least two insulator layers are formed on said first main surface, each of them covers on a part of each drain region, a part of each source region and a source-body region of each IGFET, respectively; each said insulator layer is covered by a conductor serving as a gate of each said IGFET of a first conductivity type, said gates control currents of said IGFETs of a first conductivity type serving as said controlled current sources of said carriers of two types.

5. The semiconductor device according to claim 1, wherein said second semiconductor region of a second conductivity type is divided into three portions; each portion has its own second semiconductor region of a first conductivity type surrounded individually by each portion of said second semiconductor region of a second conductivity type and said first main surface; wherein in a first portion, a dose of doping of said second semiconductor region of a first conductivity type is larger than a dose of doping of first portion of said second semiconductor region of a second conductivity type; in a second portion, a dose of doping of said second semiconductor region of a first conductivity type is smaller than a dose of doping of second portion of said second semiconductor region of a second conductivity type;

wherein said second semiconductor region of a second conductivity type in third portion is connected with its own second semiconductor region of a first conductivity type by using a conductor; a third semiconductor region of a second conductivity type is surrounded by its own second semiconductor region of a first conductivity type and said first main surface, said third semiconductor region of a second conductivity type contains at least two IGFETs of a first conductivity type; all source regions of said IGFETs of a first conductivity type are connected through said first conductor to said third semiconductor region of a second conductivity type; at least two drain regions of said IGFETs of a first conductivity type are connected with said second semiconductor regions of a first conductivity type of said first portion and of said second portion, respectively; at least two insulator layers are formed on said first main surface, each of them covers on a part of each drain region, a part of each source region and a source-body region of each IGFET of a first conductivity type, respectively; each said insulator layer is covered by a conductor serving as a gate of each said IGFET of a first conductivity type, said gates control currents of said IGFETs of a first conductivity type serving as said controlled current sources of said carriers of two types;

wherein said three portions of said second semiconductor region of a second conductivity type are partly divided, where divided parts are isolated one to another by trenches filled with insulators.

6. The semiconductor device according to claim 1, wherein said second semiconductor region of a second conductivity type is divided into three portions; each portion has its own second semiconductor region of a first conductivity type surrounded individually by each portion of said second semiconductor region of a second conductivity type and said first main surface; wherein, in a first portion, a dose of doping of said second semiconductor region of a first conductivity type is larger than a dose of doping of first portion of said second semiconductor region of a second conductivity type; in a second portion, a dose of doping of said second semiconductor region of a first conductivity type is smaller than a dose of doping of second portion of said second semiconductor region of a second conductivity type;

wherein said second semiconductor region of a second conductivity type in third portion is connected with its own second semiconductor region of a first conductivity type by using a conductor; a third semiconductor region of a second conductivity type is surrounded by its own second semiconductor region of a first conductivity type and said first main surface, said third semiconductor region of a second conductivity type contains at least two IGFETs of a first conductivity type; all source regions of said IGFETs of a first conductivity type are connected through first electrode to said third semiconductor region of a second conductivity type; at least two drain regions of said IGFETs of a first conductivity type are connected with said second semiconductor regions of a first conductivity type of said first portion and of said second portion, respectively; at least two insulator layers are formed on said first main surface, each of them covers on a part of each drain region, a part of each source region and a source-body region of each IGFET, respectively; each said insulator layer is covered by a conductor serving as a gate of each said IGFET of a first conductivity type, said gates control currents of said IGFETs of a first conductivity type serving as said controlled current sources of said carriers of two types;

wherein said three portions of said second semiconductor region of a second conductivity type are connected each other.

7. The semiconductor device according to claim 3, wherein said second semiconductor region of a first conductivity type in said second portion is connected with an additional semiconductor region of a second conductivity type in said second semiconductor region of a first conductivity type through a conductor.

8. The semiconductor device according to claim 1, wherein a connection method of said another portion of said second semiconductor region of a second conductivity type to said first terminal of said second controlled current source is:

a second semiconductor region of a first conductivity type surrounded by said second semiconductor region of a second conductivity type and said first main surface, and both regions are connected through a conductor on said first main surface; a third semiconductor region of a second conductivity type is surrounded by said second semiconductor region of a first conductivity type and said first main surface; at least two IGFETs of a first conductivity type are implemented in said third semiconductor region of a second conductivity type; all source regions of said IGFETs of a first conductivity type are connected with said third semiconductor region of a second conductivity type, which serves as a source-body region of said IGFETs of a first conductivity type, through a conductor serving as said first electrode on said first main surface; a semiconductor region of a second conductivity type is surrounded by one of two drain regions of said IGFETs of a first conductivity type and said first main surface, and is connected through a conductor to a second semiconductor region of a second conductivity type; at least two insulator layers are covered on said first main surface, each one is started from a part of a drain region via a third semiconductor region of a second conductivity type as source-body region and ended at a part of a source region; each said insulator layer is covered by a conductor serving as a gate of each said IGFET of a first conductivity type, said gates control currents through said IGFETs of a first conductivity type serving as said controlled current sources of said carriers of two types.

9. The semiconductor device according to claim 1, wherein said current sources are implemented in said third semiconductor region of a second conductivity type which is isolated with other regions.

10. The semiconductor device according to claim 1, wherein said gate of said IGFET of a first conductivity type of said cell of said second kind is connected to a heavily doped first semiconductor region of a first conductivity type located beneath said first main surface through a conductor.

11. The semiconductor device according to claim 3, wherein a IGFET is formed for helping conduct said second semiconductor region of a second conductivity type and said third semiconductor region of a second conductivity type;

said IGFET is that said second portion of second semiconductor region of a second conductivity type serves as a source region, said second semiconductor region of a first conductivity type serves as a substrate region and said third semiconductor region of a second conductivity type serves as a drain region of said IGFET, respectively;

or said IGFET is that said second semiconductor region of a first conductivity type in said third portion serves as a drain region, said third semiconductor region of a second conductivity type serves as a substrate region and a semiconductor region of a first conductivity type formed in said third semiconductor region of a second conductivity type serves as a source region of said IGFET, respectively;

an insulator covers on said first main surface starting from a part of said source region, via said substrate region and ending at a part of drain region of said IGFET; said insulator is covered by a conductor serving as a gate of said IGFET, a voltage applied on said gate controls a current flowing through said IGFET.

12. The semiconductor device according to claim 4, wherein at least two series clamping diodes are implemented between said second semiconductor region of a second conductivity type and said third semiconductor region of a second conductivity type.

13. The semiconductor device according to claim 1, wherein said cell of said first kind has a heavily doped semiconductor region of a first conductivity type contacted directly with said first semiconductor region of a first conductivity type beneath said first main surface, a conductor is formed on said heavily doped semiconductor region of a first conductivity type, a second semiconductor region of a first conductivity type is inside said second semiconductor region of a second conductivity type and both regions are connected each other through a conductor; a third semiconductor region of a second conductivity type is inside said second semiconductor region of a first conductivity type;

a third semiconductor region of a first conductivity type is surrounded by said third semiconductor region of a second conductivity type and said first main surface;

a fourth semiconductor region of a second conductivity type is surrounded by said third semiconductor region of a first conductivity type; said fourth semiconductor region is contacted with a conductor connected to said conductor formed on said heavily doped semiconductor region of a first conductivity type;

a conductor is contacted directly with said a third semiconductor region of a first conductivity type, one terminal of a capacitor is connected with said conductor contacted directly with said a third semiconductor region of a first conductivity type and the other terminal of said capacitor is connected with said first electrode; said capacitor serves as a power supply of a low-voltage circuit implemented in said third semiconductor region of a second conductivity type; where at least one input terminal of said low-voltage circuit receives an external applied signal and output terminals of said low-voltage circuit can be applied for controlling said two current sources and/ or can be connected to said second semiconductor region of a second conductivity type.

14. The semiconductor device according to claim 1, wherein: a conductor is contacted to a portion of said junction edge termination region close to its second side on the first main surface; said conductor is connected to a semiconductor region of a first conductivity type surrounded by a semiconductor region of a second conductivity type and said first main surface, and located outside of said second side of said junction edge termination region; a terminal of a capacitor is connected to said semiconductor region of a second conductivity type located outside of said junction edge termination region, another terminal of said capacitor is connected to a semiconductor region of a first conductivity type located outside of said second side of said junction edge termination region;
  said capacitor serves as a power-supply to a low-voltage circuit outside said second side of said junction edge termination region.

15. The semiconductor according to claim 12, wherein: a semiconductor region of a first conductivity type is surrounded by said second semiconductor region of a second conductivity type and said first main surface, forming a first diode; a semiconductor region of a second conductivity type is surrounded by a semiconductor region of a first conductivity type and said first main surface in said third semiconductor region of a second conductivity type, forming a second diode; said semiconductor region of a first conductivity type of said second diode is connected with said third semiconductor region of a second conductivity type by using a conductor; said semiconductor region of a first conductivity type of said first diode is connected with said semiconductor region of a second conductivity type of said second diode.

16. The semiconductor according to claim 11, wherein said voltage applied on said gate of said IGFET is a same voltage of said drain region.

* * * * *